United States Patent
Kang

(10) Patent No.: US 6,707,700 B2
(45) Date of Patent: Mar. 16, 2004

(54) NONVOLATILE FERROELECTRIC MEMORY DEVICE AND DRIVING METHOD THEREOF

(75) Inventor: Hee Bok Kang, Daejon (KR)

(73) Assignee: Hynix Demiconductor Inc., Kyoungki-do (KR)

( * ) Notice: Subject to any disclaimer, the term of this patent is extended or adjusted under 35 U.S.C. 154(b) by 0 days.

(21) Appl. No.: 10/286,809

(22) Filed: Nov. 4, 2002

(65) Prior Publication Data

US 2003/0086312 A1 May 8, 2003

(30) Foreign Application Priority Data

Nov. 5, 2001 (KR) ...................................... P2001-68652

(51) Int. Cl.[7] .............................................. G11C 11/22
(52) U.S. Cl. ............. 365/145; 365/185.05; 365/185.23; 365/230.06
(58) Field of Search ............................ 365/145, 185.05, 365/185.11, 185.23, 189.01, 189.11, 230.06, 230.08

(56) References Cited

U.S. PATENT DOCUMENTS 5,329,480 A * 7/1994 Wu et al. .................... 365/170
5,396,455 A * 3/1995 Brady et al. .................. 365/97
2003/0103373 A1 * 6/2003 Kang ......................... 365/145
2003/0112650 A1 * 6/2003 Kang ......................... 365/145

* cited by examiner

*Primary Examiner*—Gene Auduong
(74) *Attorney, Agent, or Firm*—Morgan, Lewis & Bockius LLP

(57) ABSTRACT

A nonvolatile memory device and driving method comprises a plurality of cell array blocks, each cell array block including a plurality of sub-cell array blocks, each sub-cell array block including a plurality of unit cells, a plurality of main bitlines formed in the sub-cell array blocks in one direction, a plurality of sub-bitlines aligned in the sub-cell array blocks in a same direction of the main bitlines so as to be connected to terminals of the unit cells to induce voltages on the unit cells, respectively, a sense amplifier block having a plurality of sense amplifiers shared in common by a plurality of the cell array blocks to amplify a signal of each of the main bitlines, and at least one switching transistor formed at least at one of each cell array block, the transistor having a gate controlled by a corresponding one of the sub-bitline which receives a voltage value induced from the unit cell, a drain connected to a corresponding one of the main bitlines, and a source connected to a ground voltage terminal, the switching transistor capable of current-sensing a data value of the unit cell by varying a voltage transferred to the corresponding main bitline as a current amount varies according with the voltage induced on the corresponding one of the sub-bitlines.

21 Claims, 23 Drawing Sheets

US 6,707,700 B2

NONOVOLATILE FERROELECTRIC MEMORY DEVICE AND DRIVING METHOD THEREOF

This application claims the benefit of Korean Patent Application No. P2001-68652 filed in Korea on Nov. 5, 2001, which is hereby incorporated by reference.

BACKGROUND OF THE INVENTION

1. Field of the Invention

The present invention relates to a semiconductor memory, and more particularly, to a nonvolatile memory device and a driving method thereof enabling to reduce a layout and provide an excellent sensing margin using current sensing even if a capacitance load of a main bitline is heavy.

2. Discussion of the Related Art

Generally, a nonvolatile ferroelectric memory device, i.e. FRAM (ferroelectric random access memory), has a data processing speed similar to that of DRAM as well as enables to keep data in store when power is off, thereby attracting public attention as a next generation memory device.

FRAM is a memory device having a structure similar to that of DRAM, and uses ferroelectrics as a capacitor material so as to apply a ferroelectric characteristic of high remaining polarization thereto Data fails to be erased owing to such a remaining polarization characteristic even if an electric field is removed.

FIG. 1 illustrates a graph of a hysteresis loop characteristic of general ferroelectrics.

Referring to FIG. 1, polarization induced by an electric field fails to be eliminated even if the electric field is removed, but maintains a predetermined quantity (d or a state) owing to remaining polarization (or spontaneous polarization).

A nonvolatile ferroelectric memory cell is a memory device using the d and a states as 1 and 0, respectively.

A nonvolatile ferroelectric memory according to a related art is explained in the following by referring to the attached drawings.

FIG. 2 illustrates a diagram of a unit cell of a general ferroelectric memory.

Referring to FIG. 2, a bitline B/L is formed in one direction, a wordline W/L is formed in a direction crossing with the bitline B/L, a plate line P/L is formed in the same direction of the wordline W/L so as to leave a predetermined interval from the wordline, a transistor T1 is formed so that a gate and a source are connected to the word and bitlines, respectively, and a ferroelectric capacitor FC1 is formed so that first and second terminals of the ferroelectric capacitor FC1 are connected to a drain of the transistor T1 and the plate line P/L, respectively.

Data input/output operation of such a nonvolatile ferroelectric memory device is explained as follows.

FIG. 3A illustrates an operation timing diagram of a ferroelectric memory at write mode, and FIG. 3B illustrates an operation timing diagram of a ferroelectric memory at read mode.

First of all, in case of a write mode, a chip enable signal CSBpad applied from outside is activated high to low, and simultaneously, a write enable signal WEBpad is applied high to low. Thus, the write mode is initiated.

Subsequently, once address decoding starts at the write mode, a pulse applied to the corresponding wordline is shifted low to high so as to select a cell.

Hence, high and low signals for predetermined sections are successively applied to the corresponding plate line in a section that the wordline maintains the high state. And, in order to write a logic value "1" or "0" on the selected cell, a high of low signal synchronized with the write enable signal WEBpad is applied to the corresponding bitline.

Namely, if the signal applied to the plate line is low in the section that the signal applied to the wordline is high and that the high signal is applied to the bitline, the logic value "1" is recorded in the ferroelectric capacitor. If the signal applied to the plate line is high when the low signal is applied to the bitline, the logic value "0" is recorded in the ferroelectric capacitor.

Operation of reading data stored in the cell is explained as follows.

When the chip enable signal CSBpad is activated high to low externally, all the bitlines are equalized into a low voltage by an equalizing signal before the corresponding wordline is selected.

After each bitline is deactivated, the address is decoded. Then, the low signal at the corresponding wordline is shifted to the high signal by the decoded address so as to select the corresponding cell. The high signal is applied to the plate line of the selected cell, whereby a data Qs corresponding to the logic value "1" stored in the ferroelectric memory is destroyed.

If the logic value "0" is stored in the ferroelectric memory, a data Qns is not destroyed. The destroyed and non-destroyed data output values different from each other by the hysteresis loop principle, whereby a sense amplifier senses the logic value "1" or "0".

Namely, in case that the data is destroyed, the state is changed from d to f like the hysteresis loop in FIG. 1. And, in case that the data is not destroyed, the state is changed from a to f. Hence, when the sense amplifier is enabled after lapse of a time, amplification occurs so as to output the logic value "1" in case that the data is destroyed. And, when the data is not destroyed, amplification occurs to output the logic value "0".

The original data should be restored after the sense amplifier has amplified the data. Hence, the plate line is deactivated "high" to "low" while the high signal is applied to the corresponding wordline.

Explained in the following is a nonvolatile ferroelectric memory having a hierarchical folded bitline structure according to a first method of the related art.

Referring to FIG. 4A, a nonvolatile ferroelectric memory mainly includes a top cell array block 10 and a bottom cell array block 11. And, a sense amplifier 12 is arranged every two bitlines in the middle of the top and bottom cell array blocks 10 and 11.

In this case, the bitline means a main bitline. Besides, a sub-bitline (not shown in FIG. 4A) is further includes so as to correspond to one main bitline.

Moreover, a switching control block (not shown in FIG. 4A) is further included so as to control a connection between the main bitline and sub-bitline as well as a voltage transferred to a ferroelectric capacitor of each cell.

Column switch blocks 13 and 14 are connected to both ends of each of the bitlines, respectively. And, data buses io<m>, . . . , and io<n> are connected to the column switch blocks 13 and 14.

And, a main amplifier at one corner of the entire cell array block is connected to each of the data buses io<m>, . . . , and io<n> of the top and bottom cell array blocks 10 and 11.

Each of the top and bottom cell array blocks 10 and 11 includes a plurality of sub-cell array blocks 15_0~15_n and 16_0~16_n.

And, reference cell array blocks 17 and 18 are included so as to correspond to the top and bottom cell array blocks 10 and 11, respectively.

In this case, the reference cell array block 17 is constituted between the top cell array block 10 and the corresponding column switch blocks 13.

And, the reference cell array block 18 is constituted between the bottom cell array block 11 and the corresponding column switch blocks 14.

A nonvolatile ferroelectric memory having a hierarchical open bitline structure according to a second method of the related art, as shown in FIG. 4B, has the same constitution in FIG. 4A but differs from the first method only in that one sense amplifier 22 is connected to each main bitline and cells of each cell array block are formed at each of pairs of word and plate lines and a sub-bitline.

Unfortunately, the nonvolatile ferroelectric memory device according to the related art has the following problems or disadvantages.

First, it is difficult to reduce a layout since the sense amplifier is arranged at each cell array block.

Second, the cell data is processed by voltage sensing. Hence, a sensing margin is decreased when a capacitance load of the main bitline is large or the main bitline has a capacitance mismatch.

SUMMARY OF THE INVENTION

Accordingly, the present invention is directed to a nonvolatile ferroelectric memory device and a driving method thereof that substantially obviate one or more problems due to limitations and disadvantages of the related art.

An object of the present invention is to provide a nonvolatile ferroelectric memory device and a driving method thereof enabling to reduce a layout effectively as well as be suitable for increasing a sensing margin.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile ferroelectric memory device according to the present invention includes a plurality of cell array blocks, each of the cell array blocks comprising a plurality of sub-cell array blocks, each of the sub-cell array blocks including a plurality of unit cells, a plurality of main bitlines formed in the sub-cell array blocks in one direction so as to correspond to each other by column unit, a plurality of sub-bitlines aligned in the sub-cell array blocks in a same direction of the main bitlines so as to be connected to one terminals of the unit cells to induce voltages on the unit cells, respectively, a sense amplifier block having a plurality of sense amplifiers shared in common by a plurality of the cell array blocks so as to amplify a signal of each of the main bitlines, and at lease one switching transistor formed at each of the cell array blocks, the switching transistor having a gate controlled by the corresponding sub-bitline receiving a voltage value induced from the unit cell, a drain connected to the corresponding main bitline, and a source connected to a ground voltage terminal, the switching transistor current-sensing a data value of the unit cell by varying a voltage transferred to the corresponding main bitline as a current amount varies in accordance with the voltage induced on the sub-bitline.

In another aspect of the present invention, a method of driving a nonvolatile ferroelectric memory device includes the steps of preparing the nonvolatile ferroelectric memory device including a plurality of cell array blocks sharing to use a sense amplifier block in common and controlled by a sub-bitline receiving a voltage value induced from a unit cell so as to sense a data value stored in the unit cell by sensing a voltage of a main bitline connected to a drain terminal of a first switching transistor of which current value is varied in accordance with the data value of the unit cell, inducing the data value stored in the unit cell to the sub-bitline by applying a voltage of high level to a wordline and a plate line, sensing the data value stored in the unit cell by comparing a voltage value of the main bitline connected to the drain terminal of the first switching transistor to a reference value wherein the current value flowing through the first switching transistor varies in accordance with a value induced to the sub-bitline, and writing a logic "1" data on the unit cell for an active section by a self-boosting operation and a logic "0" data on the unit cell for a precharge section following the active section.

The present invention relates to FeRAM performing a data sensing using a current. When there are a plurality of groups of cell arrays, the layout according to the present invention enables to read data of the group of the cell arrays through a single sensing unit.

The present invention is characterized in that the first sub-bitline switching signal SBSW1 becomes VCC level only when the logic data "0" is written on the unit cell array in such a layout and that the NMOS transistor performing a switching operation by a control of the sub-bitline SBL is further included.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A nonvolatile ferroelectric memory device and a driving method thereof according to the present invention are explained as follows.

Figure 1:
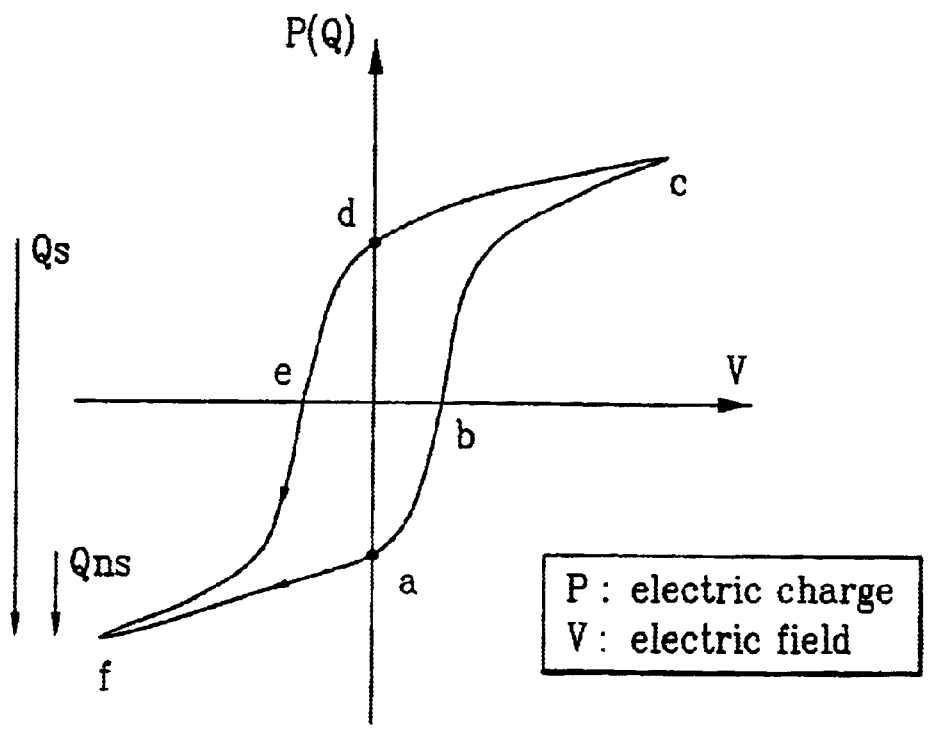
FIG. 1 illustrates a graph of a hysteresis loop characteristic of general ferroelectrics.
Figure 2:
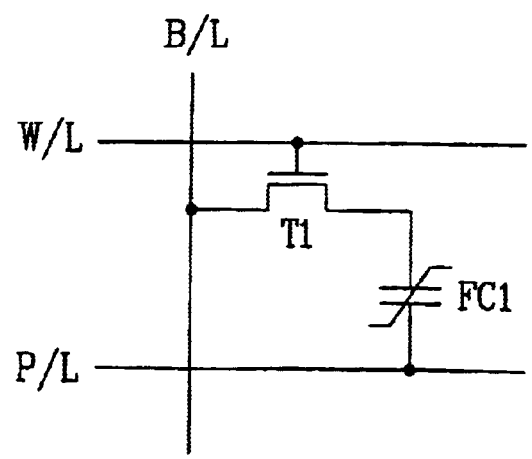
FIG. 2 illustrates a diagram of a unit cell of a general ferroelectric memory.
Figure 3A:
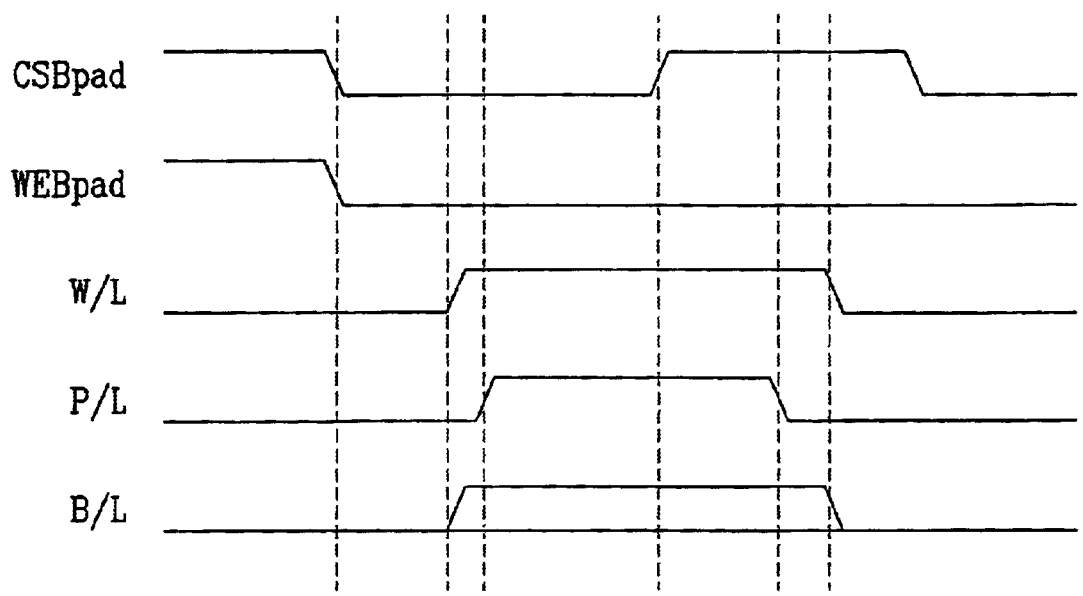
FIG. 3A illustrates an operation timing diagram of a ferroelectric memory at write mode.
Figure 3B:
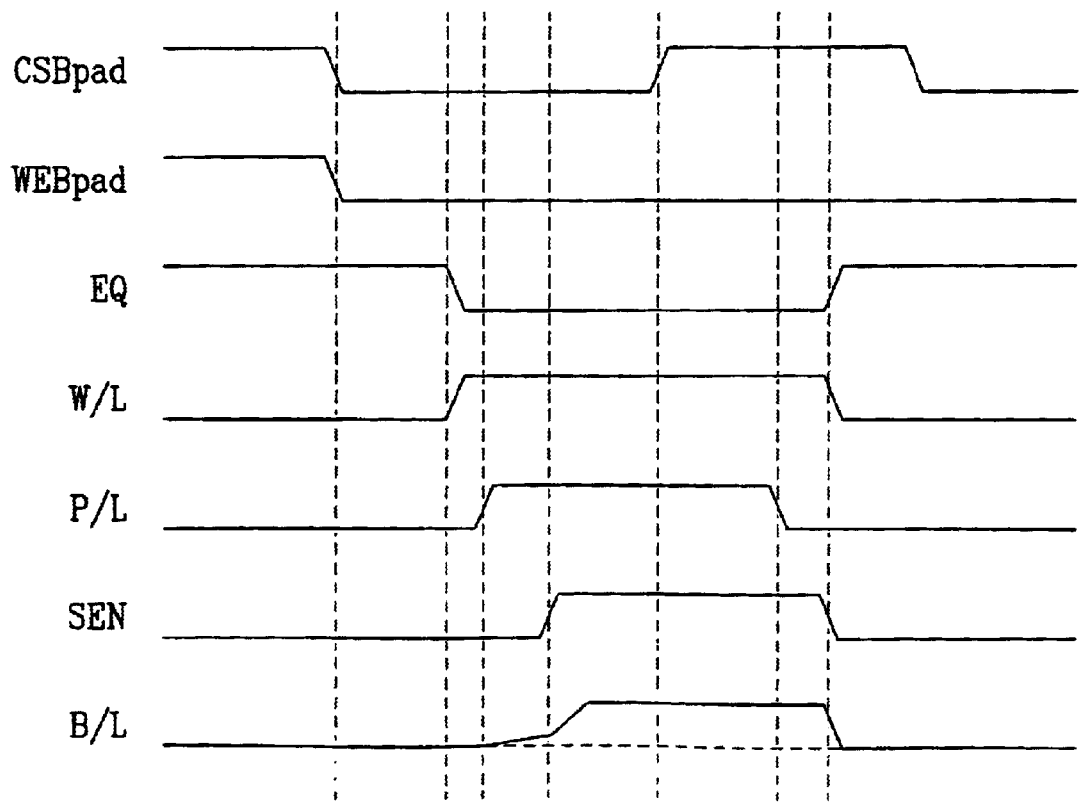
FIG. 3B illustrates an operation timing diagram of a ferroelectric memory at read mode.
Figure 4A:
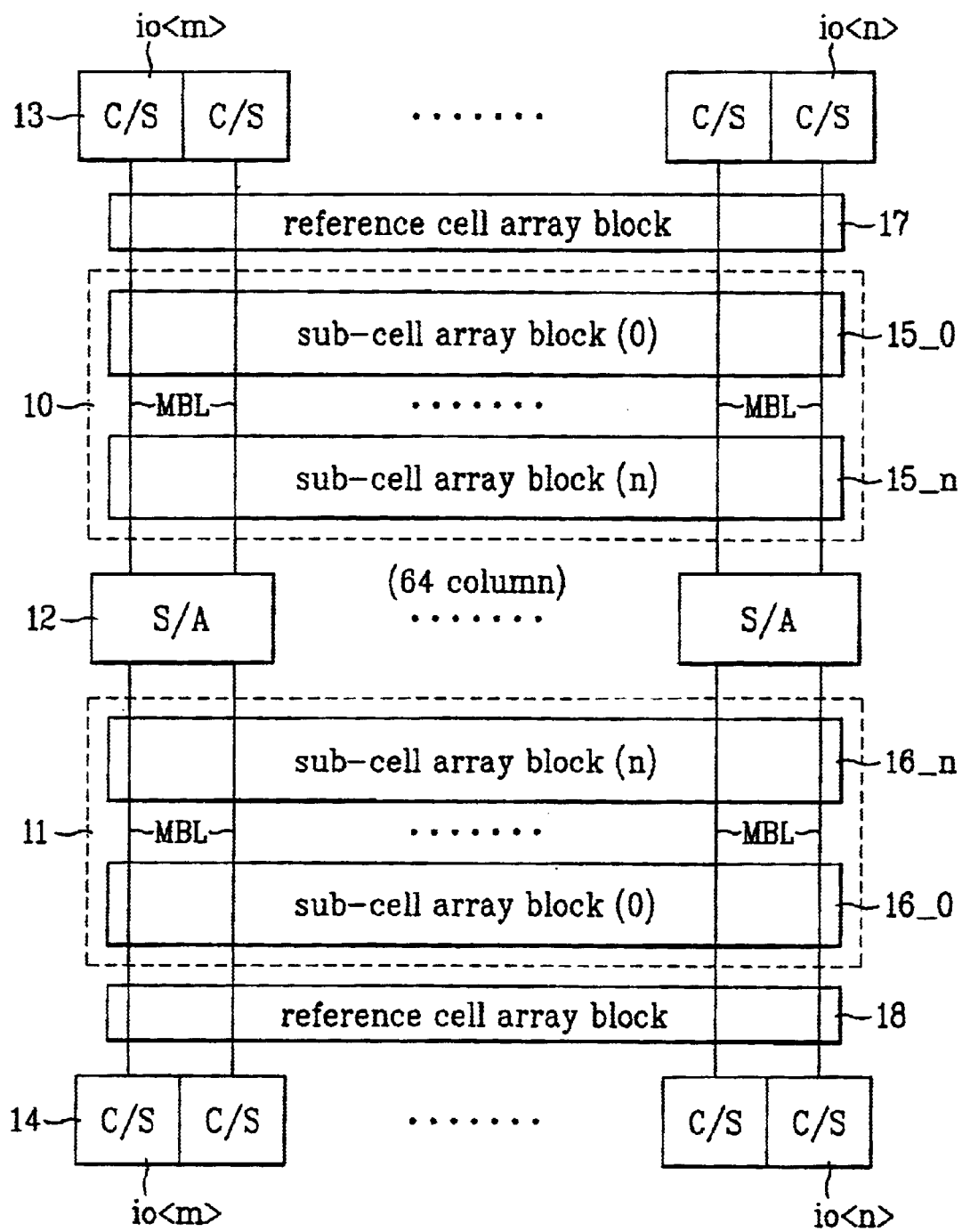
FIG. 4A illustrates a block diagram of an array of a nonvolatile ferroelectric memory according to a first method of the related art.
Figure 4B:
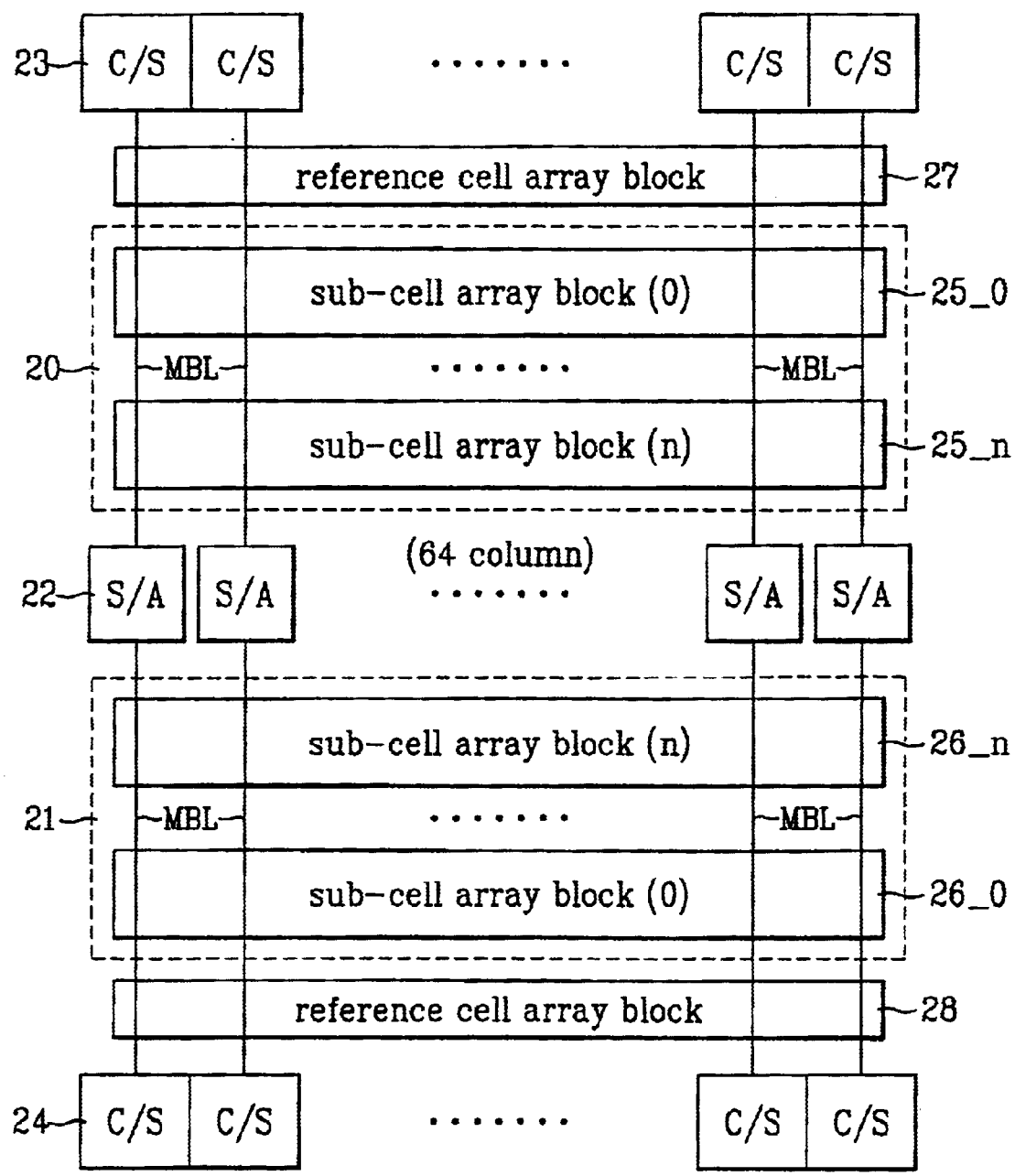
FIG. 4B illustrates a block diagram of an array of a nonvolatile ferroelectric memory according to a second method of the related art.
Figure 5A:
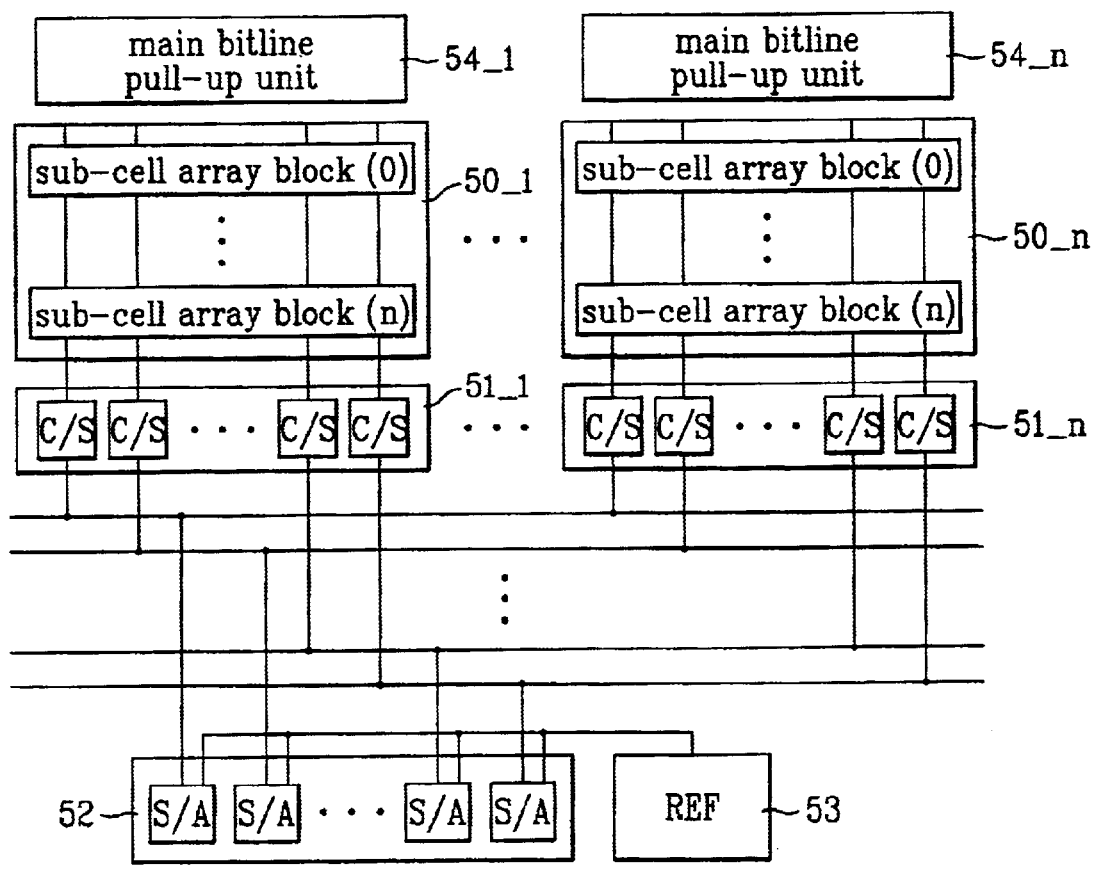
FIG. 5A and FIG. 5B illustrate block diagrams of arrays of a nonvolatile ferroelectric memory according to an embodiment of the present invention.

A nonvolatile ferroelectric memory device according to the present invention, as shown in FIG. 5A, can include a plurality of cell array units 50_1~50_n, a plurality of column selectors 51_1~51_n corresponding to the cell array units 50_1~50_n, respectively, a sense amplifier unit 52 used in common for a plurality of the cell array units, a reference generation unit 53 connected in common to a plurality of sense amplifiers in the sense amplifier unit 52, and a main bitline pull-up unit 54 for pulling up a main bitline of each cell array.

Each of the cell array units preferably includes a plurality of sub-cell array blocks. A plurality of main bitlines can be formed in each of the cell array blocks. A sub-bitline (FIG. 6 and FIG. 7) can be formed in the sub-cell array block so as to correspond to each of the main bitlines.

The main bitlines of each of the cell array units are preferably connected to column selectors C/S in the column selector unit so as to correspond one by one. A plurality of output signals passing through the column selectors can be connected to the sense amplifiers in the common sense amplifier unit 52 through a common bus signal line, respectively.

In this case, the number of the sense amplifiers in the sense amplifier unit 52 is equal to that of signal buses.

Figure 5B:
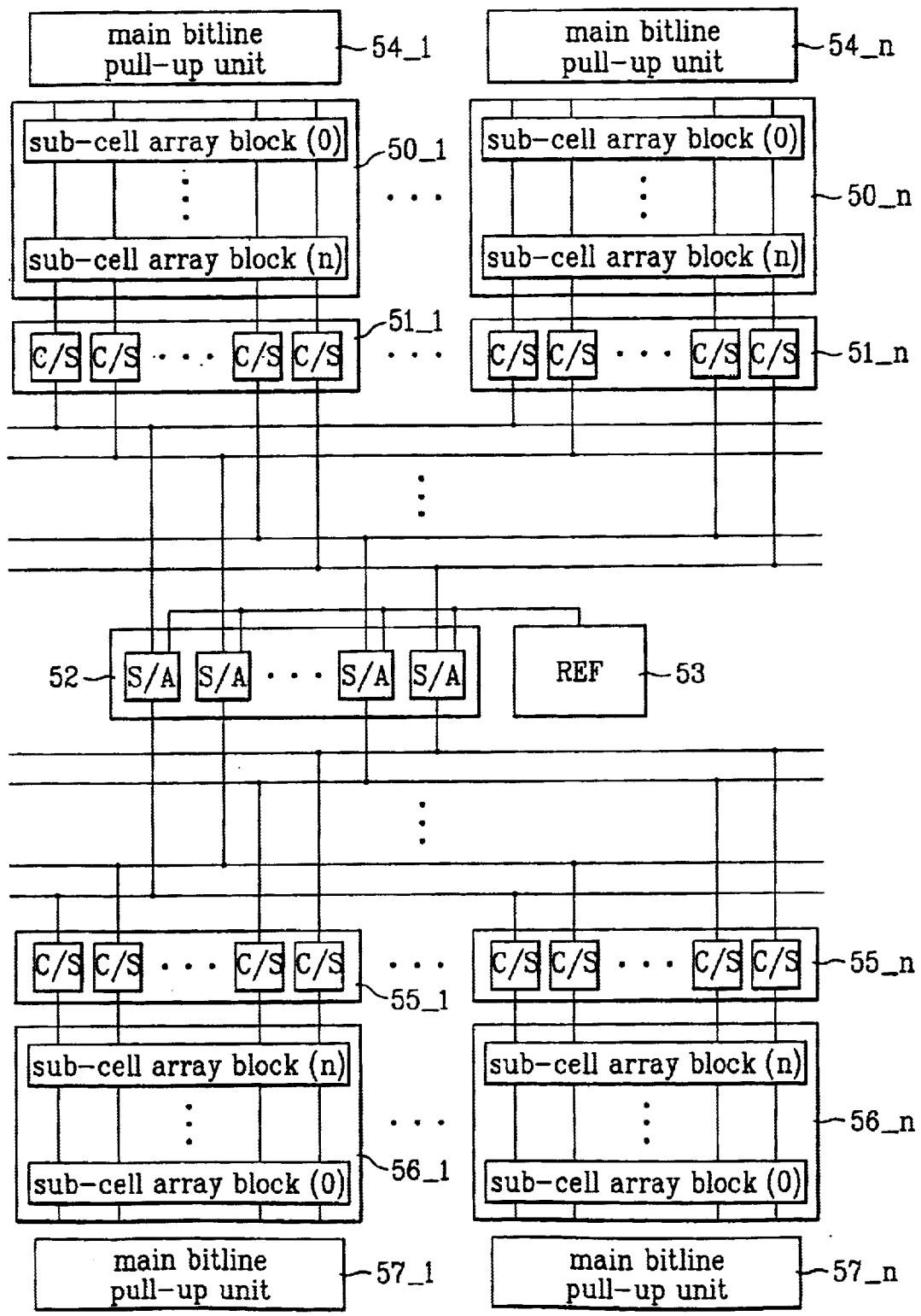

In an array of the above-constituted nonvolatile ferroelectric memory, as shown in FIG. 5B, centering around the common sense amplifier unit 52 and reference generation unit 53, a plurality of cell array units can be arranged on upper and lower parts respectively. And, the main bitline pull-up units 57 and column selectors 55 can be arranged so as to correspond to the cell array units, respectively.

In this case, the signal bus lines are arranged at the upper and lower cell array units so as to correspond to the number of the sense amplifiers.

Constitutions of sub-cell array blocks in the above-constituted nonvolatile ferroelectric memory according to first and second embodiments of the present invention are explained as follows.

Figure 6A:
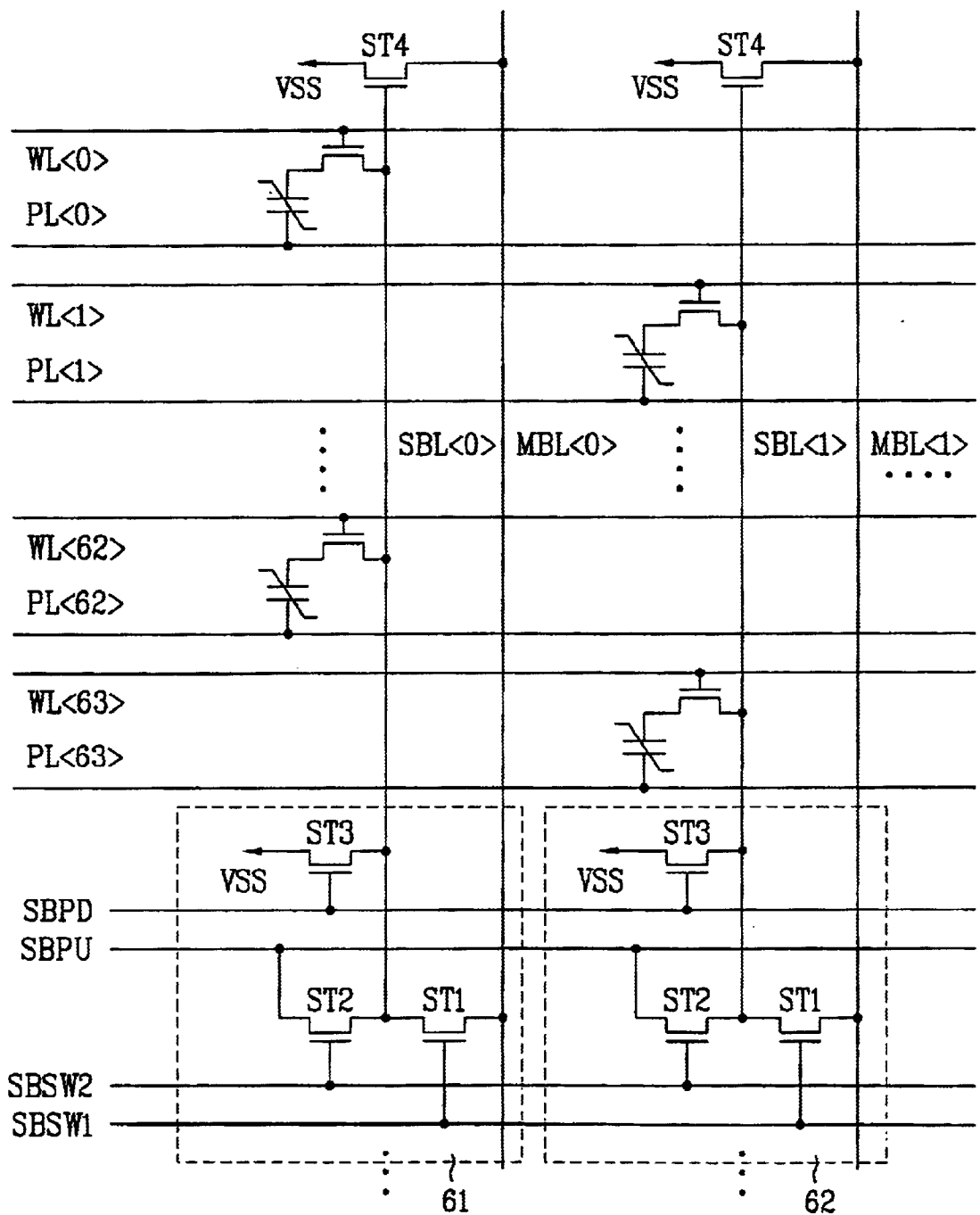
FIG. 6A and FIG. 6B illustrate detailed circuits of sub-cell array blocks according to first and second embodiments of the present invention, respectively.
Figure 6B:
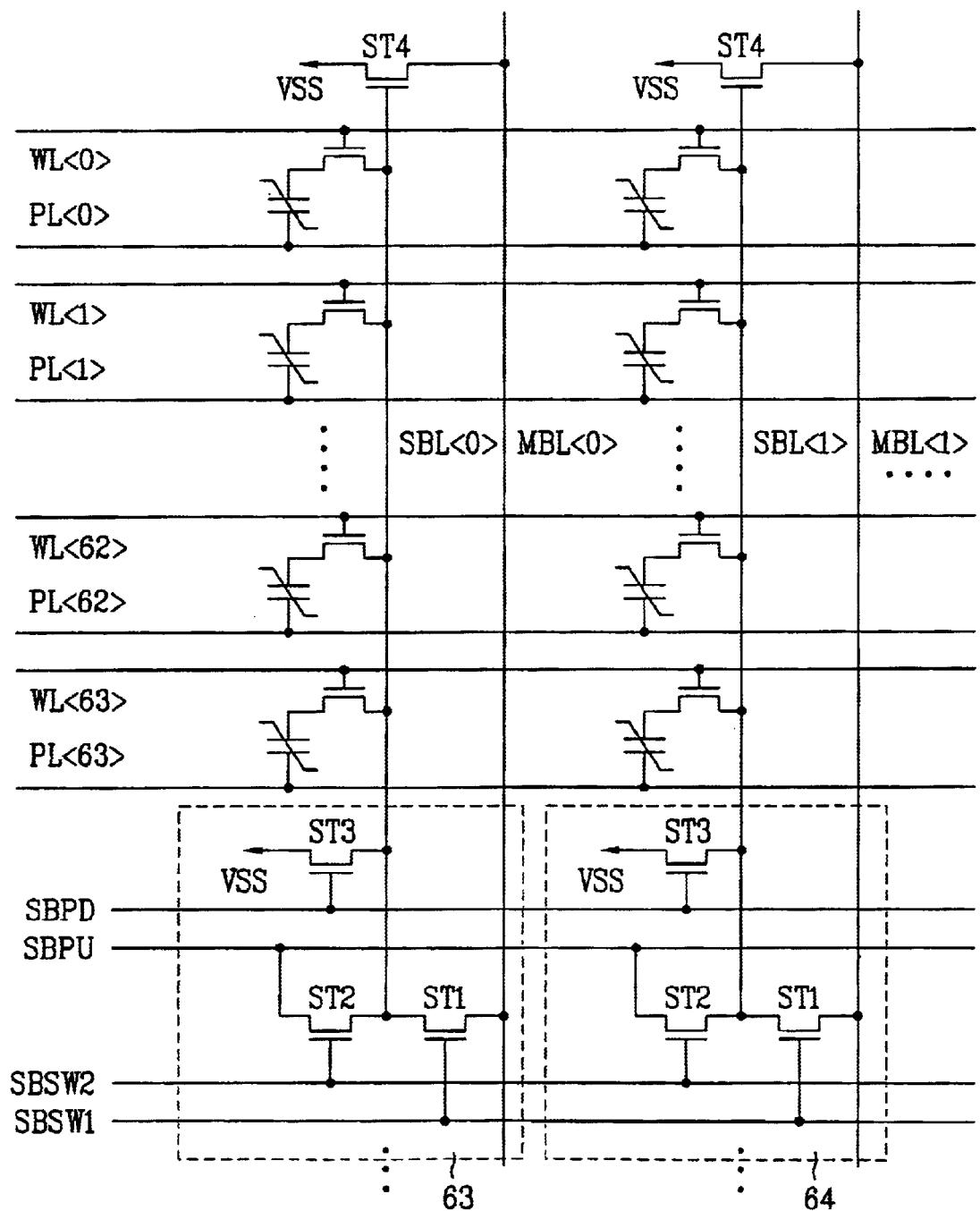

FIG. 6A and FIG. 6B illustrate detailed circuits of sub-cell array blocks according to first and second embodiments of the present invention, respectively, in which a data of a cell is sensed by a current amount.

Referring to FIG. 6A, there are a plurality of main bitlines MBL<0>, MBL<1>, ..., MBL<n> arranged in one direction and sub-bitlines SBL<0>, SBL<1>, ..., SBL<n> arranged in the same direction of the main bitlines MBL<0>, MBL<1>, ..., MBL<n> so as to be connected to unit cells in each of the sub-cell arrays.

And, wordline/plate line pairs W/L<0>, P/L<0>, ..., W/L<n>, P/L<n> are arranged to cross with the main bitlines MBL<0>, MBL<1>, ..., MBL<n>.

Each of the sub-cell array blocks can include a plurality of cells in a plurality of row and column directions.

For instance, FIG. 6A shows that each of the sub-cell arrays is constituted with 64 rows and 64 columns. And, each of the sub-cell array blocks includes a plurality of cells in a plurality of the row and column directions.

The cells in each of the row directions can be arranged at every two columns, respectively, and the cells in each of the column directions can be arranged at every two rows, respectively.

Hence, if one wordline and one plate line are activated, the cell connected to an odd or even bitline is selected only so that the even/odd bitlines, failing to be selected are used as reference lines.

In the same direction of each of the wordline/plate line pairs W/L<0>, P/L<0>, ..., W/L<n>, P/L<n>, there can be a sub-bitline pull-down signal (SBPD) applying line, first and second sub-bitline switch (SBSW1 and SBSW2) signal applying lines, and a sub-bitline pull-up (SBPU) signal applying line.

Switching control blocks 61, 62, . . . can be included. Each of the switching control blocks 61, 62, . . . can be controlled by the SBPD, SBSW1, SBSW2, and SBPU applying lines, can correspond to a single main bitline and a sub-bitline, can control whether the selected cell is connected to the main bitline or the sub-bitline, and can control a voltage transferred to a ferroelectric capacitor of the selected cell.

In this case, the switching control block 61 includes first to third switching transistors ST1, ST2, and ST3.

In this case, a gate of the first switching transistor ST1 can be connected to the SBSW1 applying line, and two electrodes of the first switching transistor ST1 can be connected to the main bitline and the sub-bitline, respectively.

A gate of the second switching transistor ST2 can be connected to the SBSW2 applying line, and two electrodes of the second switching transistor ST2 are connected to the sub-bitline and the SBPU applying line, respectively.

A gate of the third switching transistor ST3 can be connected to the SBPD applying line, and two electrodes of the third switching transistor ST3 are connected to the sub-bitline and a ground voltage terminal VSS, respectively.

A fourth switching transistor ST4 of NMOS transistor can also be provided. In the fourth switching transistor ST4, a gate end can be connected to the sub-bitline, and drain and source ends are connected to the main bitline MBL and the ground line VSS, respectively.

In this case, the fourth switching transistor ST4 is preferably formed at every sub-bitline.

A voltage corresponding to the data stored in the cell can be transferred to the sub-bitline of each of the sub-cell array blocks. This voltage can be applied to the gate electrode of the NMOS transistor through the sub-bitline.

A current value flowing through the NMOS transistor varies in accordance with a voltage size corresponding to the data stored in the cell, whereby the data of the cell can be sensed by comparing a main bitline voltage connected to the drain end of the NMOS transistor to a reference value.

One of a plurality of the sub-bitlines SBL can be connected selectively by a single operation.

Namely, one of SBSW1 signals for selecting one of a plurality of the sub-bitlines is activated so as to select one of the sub-bitlines.

Thus, a load on the bitline can be reduced to a level of a single (sub-bitline load.

Moreover, the SBL adjusts an SBL signal to become a ground voltage level when an SBPD signal is activated by a signal of the SBPD applying line.

The SBPU and SBSW2 signals are the signals for adjusting power applied to the SBL.

In a low voltage, a voltage higher than a VCC voltage is generated for supply if "high" voltage is generated.

A constitution of a sub-cell array of a nonvolatile ferroelectric memory device according to a second embodiment of the present invention is explained as follows.

Referring to FIG. 6B, there are a plurality of main bitlines MBL<0>, MBL<1>, . . . , MBL<n> arranged in one direction and sub-bitlines SBL<0>, SBL<1>, . . . , SBL<n> arranged in the same direction of the main bitlines MBL<0>, MBL<1>, . . . , MBL<n> so as to be connected to unit cells in each of the sub-cell arrays.

And, wordline/plate line pairs W/L<0>, P/L<0>, . . . , W/L<n>, P/L<n> are arranged to cross with the main bitlines MBL<0>, MBL<1>, . . . , MBL<n>.

For instance, FIG. 6B shows that each of the sub-cell arrays is constituted with 64 rows and 64 columns. And, each of the sub-cell array blocks includes a plurality of cells in a plurality of row and column directions.

The cells in each of the row directions are arranged at every one column, respectively, and the cells in each of the column directions are arranged at every one row, respectively.

In the same direction of each of the wordline/plate line pairs W/L<0>, P/L<0>, . . . , W/L<n>, P/L<n>, there are a sub-bitline pull-down signal (SBPD) applying line, first and second sub-bitline switch (SBSW1 and SBSW2) signal applying lines, and a sub-bitline pull-up (SBPU) signal applying line.

Switching control blocks 63, 64, . . . can be included. Each of the switching control blocks 63, 64, . . . is controlled by the SBPD, SBSW1, SBSW2, and SBPU applying lines, is constituted to correspond to a single main bitline and a sub-bitline, controls whether the selected cell is connected to the main bitline or the sub-bitline, and controls a voltage transferred to a ferroelectric capacitor of the selected cell.

In this case, each of the switching control blocks includes first to third switching transistors ST1, ST2, and ST3.

A gate of the first switching transistor ST1 can be connected to the SBSW1 applying line, and two electrodes of the first switching transistor ST1 are connected to the main bitline and the sub-bitline, respectively.

A gate of the second switching transistor ST2 can be connected to the SBSW2 applying line, and two electrodes of the second switching transistor ST2 are connected to the sub-bitline and the SBPU applying line, respectively.

A gate of the third switching transistor ST3 can be connected to the SBPD applying line, and two electrodes of the third switching transistor ST3 are connected to the sub-bitline and a ground voltage terminal VSS, respectively.

An NMOS transistor can be provided. In the NMOS transistor, a gate end can be connected to the sub-bitline, and drain and source ends are connected to the main bitline MBL and the ground line VSS, respectively.

In this case, the NMOS transistor is preferably formed at every sub-bitline.

A voltage corresponding to the data stored in the cell can be transferred to the sub-bitline of each of the sub-cell array blocks. This voltage is applied to the gate electrode of the NMOS transistor through the sub-bitline.

A current value flowing through the NMOS transistor varies in accordance with a voltage size corresponding to the data stored in the cell, whereby the data of the cell can be sensed by sensing a main bitline voltage connected to the drain end of the NMOS transistor.

One of a plurality of the sub-bitlines SBL is made to be connected selectively by a single operation.

Namely, one of SBSW1 signals for selecting one of a plurality of the sub-bitlines is activated so as to select one of the sub-bitlines.

Thus, a load on the bitline can be reduced to a level of a single sub-bitline load.

The above-explained sub-cell array block that can be constituted with open bitlines according to the second embodiment of the present invention has substantially the same constitution of the first embodiment of the present invention. A primary difference is that each of the cells is formed at the wordline/plate line pair and sub-bitline.

Reciprocal connection between a sense amplifier unit 82 connected to a single main bitline (MBL) and its circumferential circuits is explained as follows.

Figure 8:
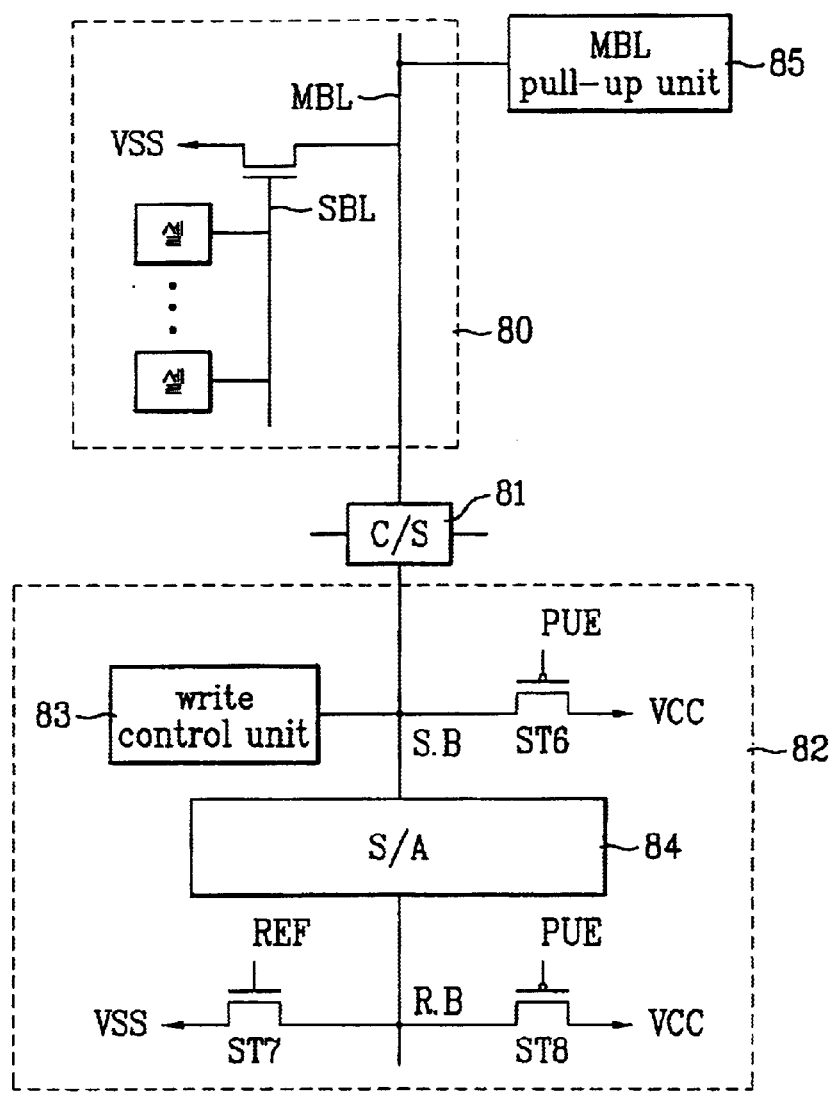
FIG. 8 illustrates schematically a structural diagram for explaining reciprocal connection between a main bitline (MBL), an MBL pull-up unit, a column selector (C/S), and a sense amplifier.

Referring to FIG. 8, a sub-bitline SBL, a main bitline pull-up unit 85, a column selector (C/S) 81, and a sense amplifier 82 are preferably connected to a single main bitline.

In this case, at least one sub-bitline SBL can be connected to one single main bitline MBL. As shown in FIG. 8, one sub-bitline can be connected to one main bitline and a plurality of cells can be connected to the sub-bitline.

Selection of the main bitline can be determined by the column selector C/S. The main bit line MBL can be pulled up by the main bitline pull-up unit 85 while not being driven.

Figure 9:
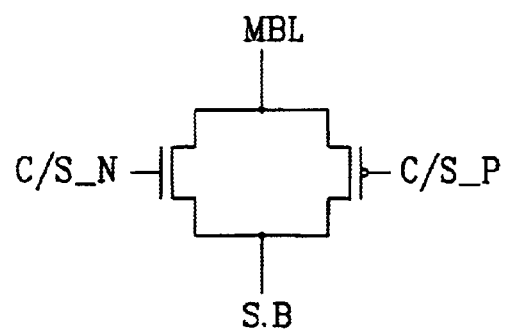
FIG. 9 illustrates a detailed circuit of a column selector (C/S).
Figure 13:
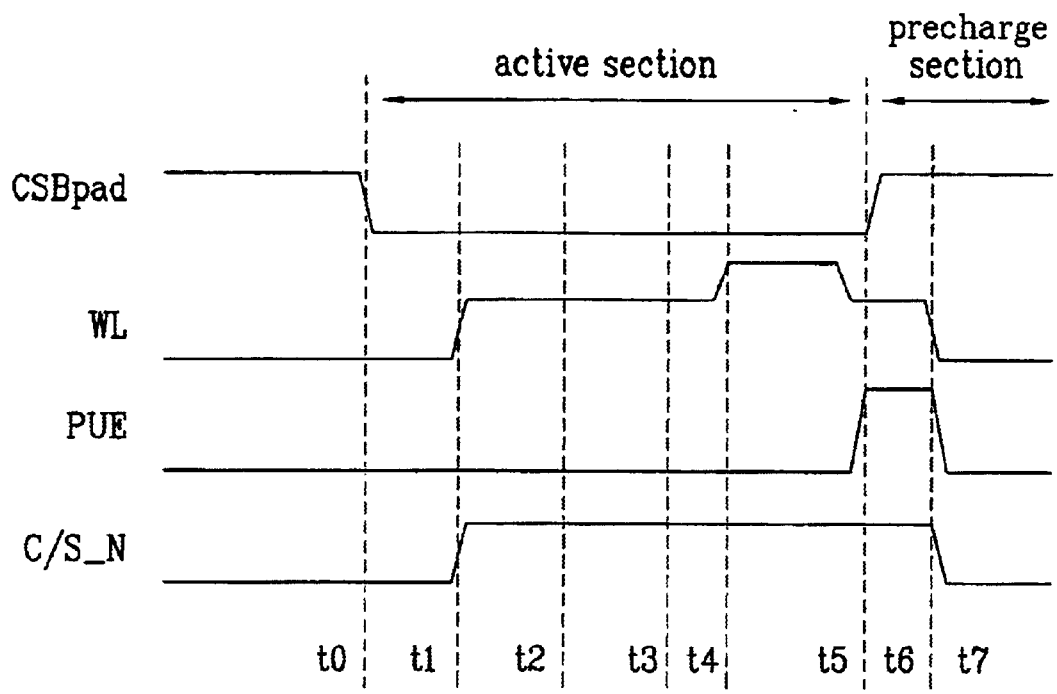
FIG. 13 illustrates an operation timing diagram of C/S_N and PUE in FIG. 8 and FIG. 9.

In this case, the column selector (C/S) 81, as shown in FIG. 9, prevents voltage drop between the main bitline MBL and a signal bus S.B. The column selector (C/S) 81 can be a transfer gate constituted with NMOS and PMOS. The column selector (C/S) 81, as shown in FIG. 13, always or substantially always outputs C/S_N as "high" level on write and read operations even if the main bitline MBL and signal bus S.B are turned on.

Figure 11:
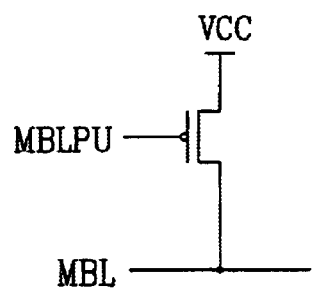
FIG. 11 illustrates a detailed circuit of the MBL pull-up unit in FIG. 8.
Figure 14:
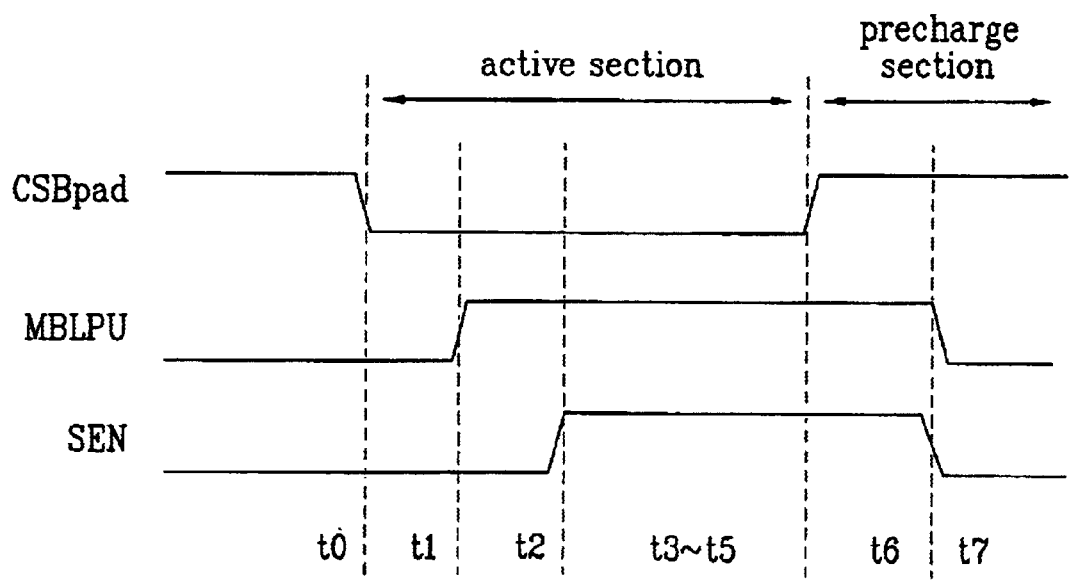
FIG. 14 illustrates an operation timing diagram of an MBL pull-up unit.

The main bitline pull-up unit 54, as shown in FIG. 11, includes a PMOS transistor driven by receiving a main bitline pull-up signal MBLPU. The main bitline pull-up unit 54, as shown in FIG. 14, outputs MBLPU as "high" level so as to turn off the PMOS transistor while the cell operates. Main bitline pull-up unit 54, as shown in FIG. 14, outputs MBLPU as "low" level so as to turn on the PMOS transistor while the cell stops operating.

The sense amplifier unit 82, as shown in FIG. 8, can include a sense amplifier 84, a write control unit 83, a sixth switching transistor ST6 between a signal bus S.B and a power supply voltage terminal VCC, a seventh switching transistor ST7 between a reference bus R.B and the ground voltage terminal VSS, and an eighth switching transistor ST8 between the reference bus R.B and power supply voltage terminal VCC.

In this case, the write control unit 83 is driven by receiving data transferred through the signal bus S.B.

The sixth and eighth switching transistors ST6 and ST8 can be constituted with load PMOS enabling to pull up the signal bus and reference buses, respectively. The second switching transistor can be constituted with NMOS.

In this case, the first and third switching transistors can be operated by receiving pull-up enable signals, respectively. Each of the first and third switching transistors becomes "OFF" when PUE is a "high" signal, or "ON" when PUE is a "low" signal.

In other words, as shown in FIG. 8 and FIG. 13, PUE preferably outputs a "high" level for a write section only so as to turn off the first and third switching transistors. And, PUE maintains a "low" level for the rest sections so as to turn on the first and third switching transistors.

The first and third switching transistors enable generation of big voltage difference from the signal bus S.B and reference bus R.B by a small main cell current and a small reference cell current.

Figure 10:
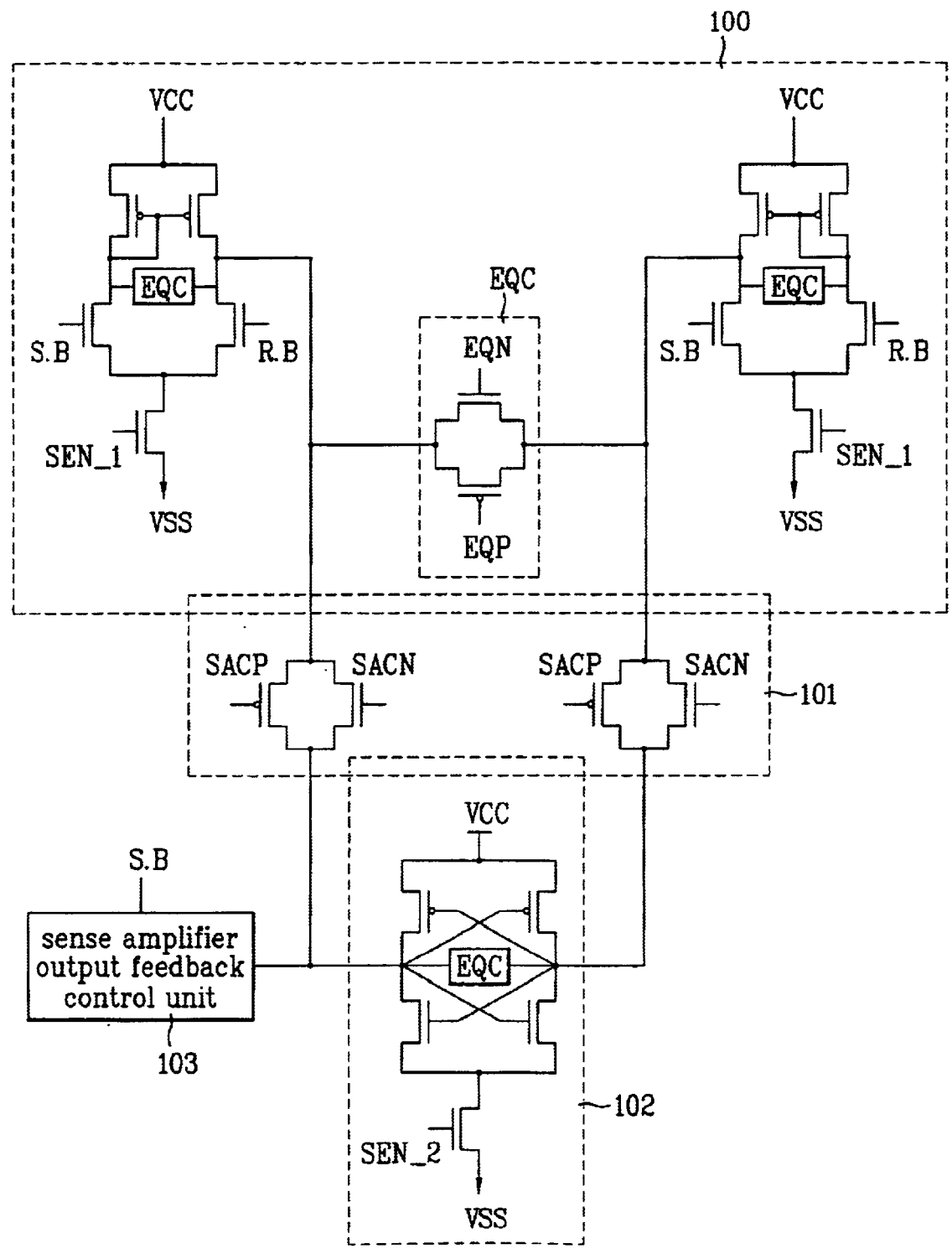
FIG. 10 illustrates a detailed circuit of a unit sense amplifier.

The sense amplifier 84 can be driven by receiving the signals transferred through the signal bus S.B and reference bus R.B, as shown in FIG. 10, and can include a current mirror type first sense amplifier 100, a sense amplifier control unit 101, and a latch type second sense amplifier 102.

A sense amplifier output feedback control unit 103 can be included between an output end of the sense amplifier unit 84 and a signal bus S.B.

In the current mirror type first amplifier 100, first and second current mirrors confront each other centering around an equalizer control unit EQC.

In the first and second current mirrors, as shown in FIG. 10, main cell data and reference cell data can be inputted to input terminals of two NMOS transistors through the signal and reference buses S.B and R.B, respectively. The equalizer control unit is formed between drain ends of two NMOS transistors.

The equalizer control unit can include a transfer gate constructed with NMOS and PMOS. An output terminal of the first current mirror is the drain end of the NMOS transistor to which the reference cell data is inputted through the reference bus R.B. An output terminal of the second current mirror is the drain end of the NMOS transistor to which the main cell data is inputted through the signal bus S.B.

The sense amplifier control unit 101 can include two transfer gates between the current type first sense amplifier 100 and the latch type second sense amplifier 102.

The sense amplifier control unit 101 can control whether output signals of the first and second current mirrors are transferred to the second sense amplifier 102 in accordance with first and second sense amplifier control signals SACN and SACP.

An equalizer control unit EQC can be formed at the latch type second sense amplifier 102 as well.

Besides, the sense amplifier output feedback control unit 103 can write or rewrite "0" data on the memory cell.

Next, a reference generation unit according to the present invention is explained as follows.

Figure 12:
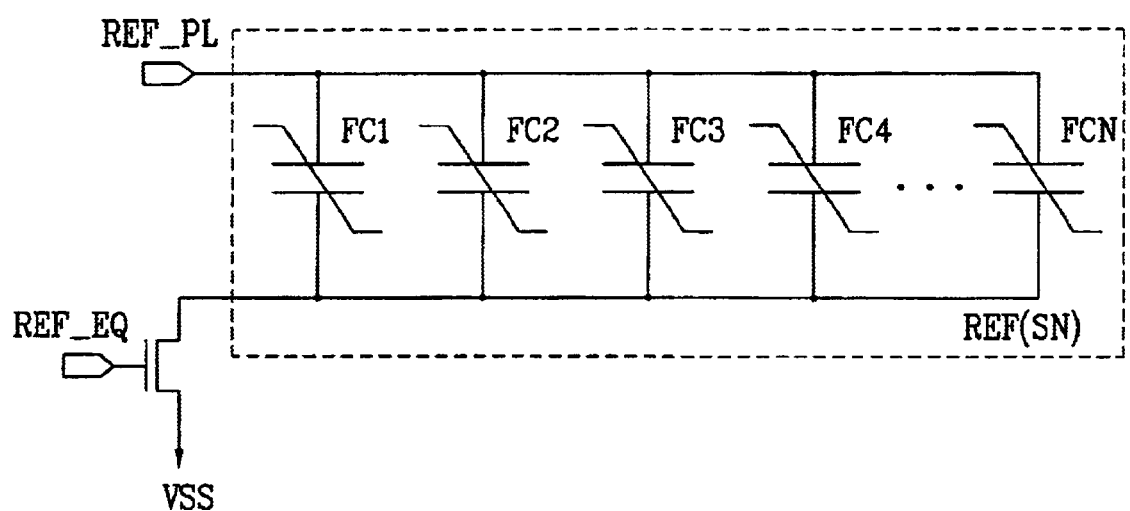
FIG. 12 illustrates a detailed circuit of a reference generation unit.

A reference generation unit according to the present invention, as shown in FIG. 12, can include a level initialization unit constituted with a plurality of reference capacitors FC1, FC2, FC3, . . . , FCN and an NMOS transistor.

In this case, first electrodes of the reference capacitors FC1, FC2, FC3, . . . , FCN can be connected in common to a reference plate line REF_PL, and second electrodes of the reference capacitors FC1, FC2, FC3, . . . , FCN can be connected in common to a reference line REF(SN) as a storage node. Thus, the reference capacitors FC1, FC2, FC3, . . . , FCN can be connected in parallel with each other.

In the level initialization unit, a cell equalizer control signal REF_EQ can be applied to a gate of the NMOS transistor, one electrode of the NMOS transistor can be connected to a ground terminal GND, and the other electrode of the NMOS transistor can be connected to the reference line REF(SN) as the storage node.

Figure 15:
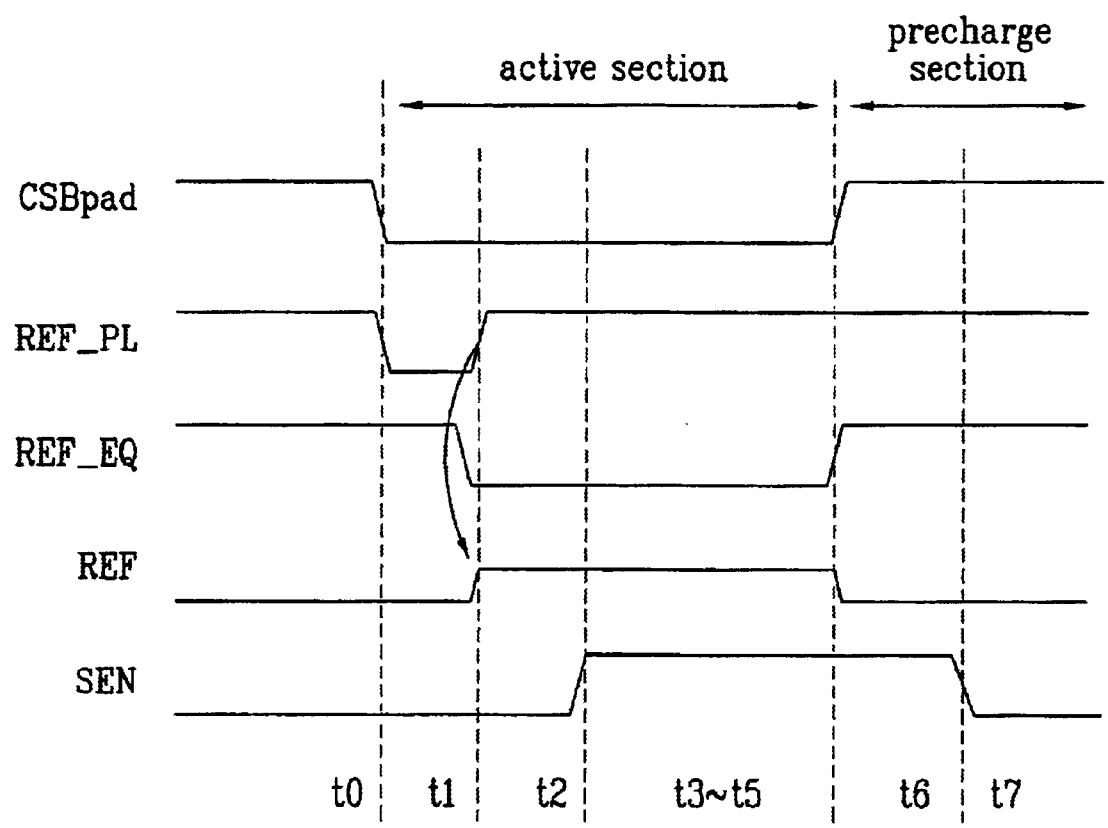
FIG. 15 illustrates an operation timing diagram of the reference generation unit in FIG. 12.

The reference generation unit, as shown in FIG. 15, shows a "low" level only for a t1 section where an active section of the reference plate line REF_PL starts.

Operation of the reference generation unit is explained in detail by dividing sections into t0~t7 as follows.

In this case, t0, t6, and t7 are precharge sections and t1~t5 sections are continuous active sections.

First, the t0 section is a precharge section prior to the active section. In the t0 section, the reference plate line REF_PL and reference cell equalizer control signal REF_EQ can output "high" levels so as to turn on the NMOS transistor constituting the level initiation unit. Hence, the output signal REF of the reference line shows a "low" level.

The t1 section is a section from which the active section can start. In the t1 section, the reference plate line REF_PL and reference cell equalizer control signal REF_EQ can output "low" and "high" levels, respectively so as to output the reference signal REF of "low" level.

For t2~t5 sections, the reference plate line REF_PL and reference cell equalizer control signal REF_EQ can output "high" and "low" levels, respectively so as to output the reference signal REF of "high" level.

Thereafter, for t6 and t7 sections, the reference plate line can keep outputting the "high" level and the reference cell equalizer control signal REF_EQ is shifted "low" to "high" level. Hence, the reference signal can output a "low" level.

In FIG. 15, the sense amplifier can output "high" level for t3~t6 sections only.

Operation of the sense amplifier according to the present invention is explained as follows.

Figure 16:
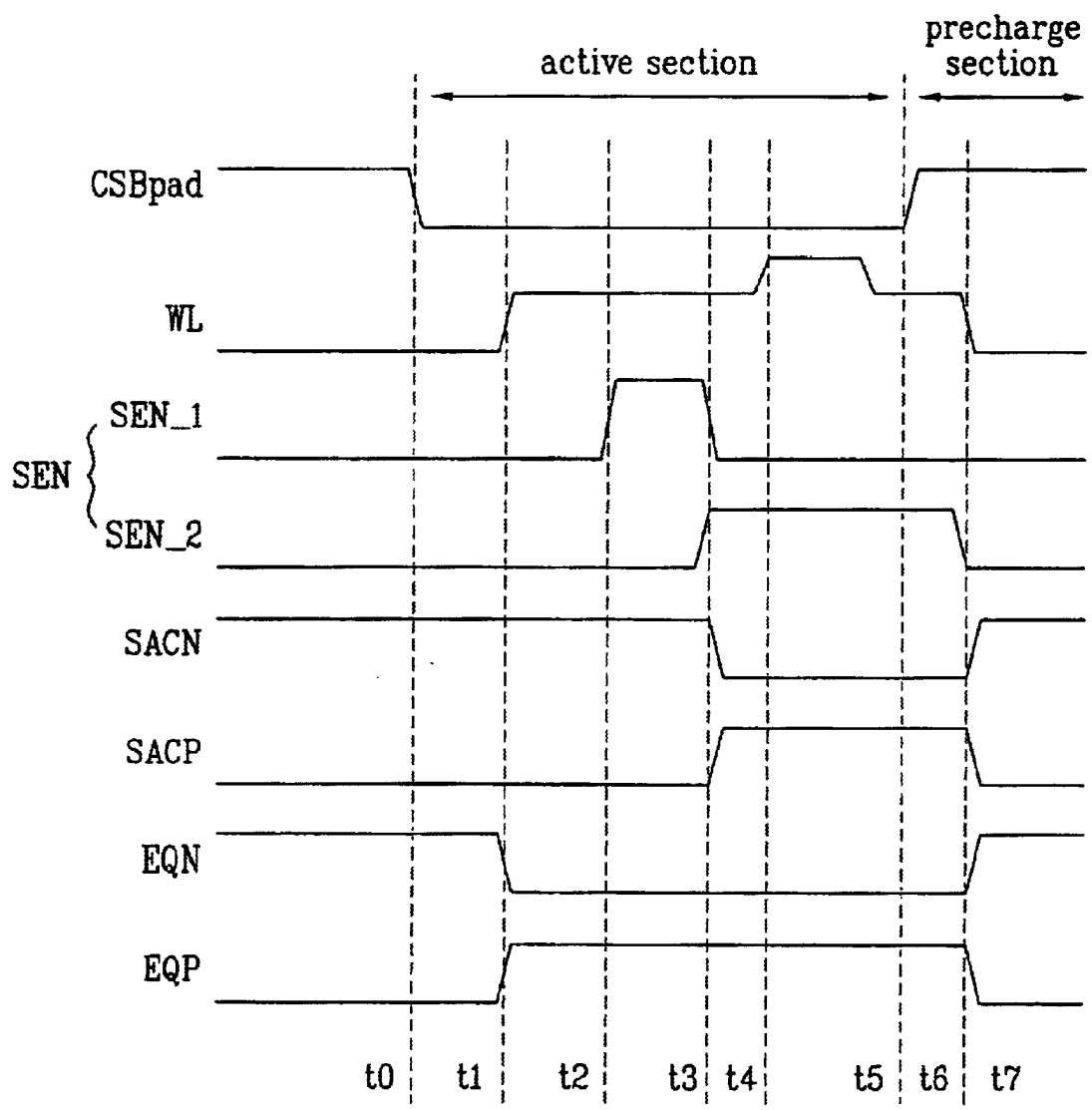
FIG. 16 illustrates an operation timing diagram of a sense amplifier.

For the operation of the sense amplifier unit, as shown in FIG. 10 and FIG. 16, the current type first sense amplifier 100 can be activated for the t3 section, and the latch type second sense amplifier 102 can be activated for the t4~t6 sections.

The operation of the sense amplifier unit can be divided into the t0~t7 sections and the respective signals so as to be explained in detail as follows.

In this case, t0, t6, and t7 can be precharge sections and t1~t5 sections can be continuous active sections.

First of all, a chip selection signal CSBpad shows "low" level for the t1~t5 sections as the active section only, a first sense amplifier input signal SEN_1 of the first sense amplifier 100 shows "high" level for the t3 section only, and a second sense amplifier input signal SEN_2 of the second sense amplifier 102 shows "high" level for the t4~t6 sections only.

A first sense amplifier control signal SACN can output "low" level for the t4~t6 sections only, and a second sense amplifier control signal SACP can output "high" level for the t4~t6 sections only.

As explained in the above description, the first and second sense amplifier control signals SACN and SACP can have phases opposite to each other so as to make the first and second sense amplifiers 100 and 102 can be disconnected from each other.

Moreover, EQN and EQP of the equalizer control unit EQC can be made to have phases opposite to each other. EQN outputs "low" level for the t2~t6 sections and EQP outputs "high" level for the t2~t6 sections, thereby deactivating the equalizer control unit EQC.

In this case, a wordline WL outputs VPP for t2~t4 and t6 sections and 2VPP boosted as VPP for the t5 section.

Overall operation using the nonvolatile ferroelectric memory device according to the present invention is explained as follows.

The present invention relates to an FeRAM memory cell array, in which a cell array can be divided into a plurality of subordinate cell arrays so as to use sub-bitlines and main bitlines.

Specifically, a current value flowing through the fourth switching transistor can vary in accordance with the cell data when a voltage induced by the cell is applied to the gate end of the fourth switching transistor through the sub-bitline. Hence, a voltage of the main bitline connected to the drain end of the fourth switching transistor ST4 can be sensed by being compared to the reference value.

A method of driving the above-operating ferroelectric memory device can be explained by being divided into the following steps of inducing a data value stored in a unit cell to a sub-bitline by applying a voltage of high level to a wordline and a plate line, sensing the data value stored in the unit cell by comparing a voltage value of a main bitline connected to a drain end of a fourth switching transistor of which current value varies in accordance with a value induced to the sub-bitline, and writing a data of logic "1" on the unit cell for an active section by self-boosting operation and a data of logic "0" on the unit cell for a precharge section following the active section.

Figure 17:
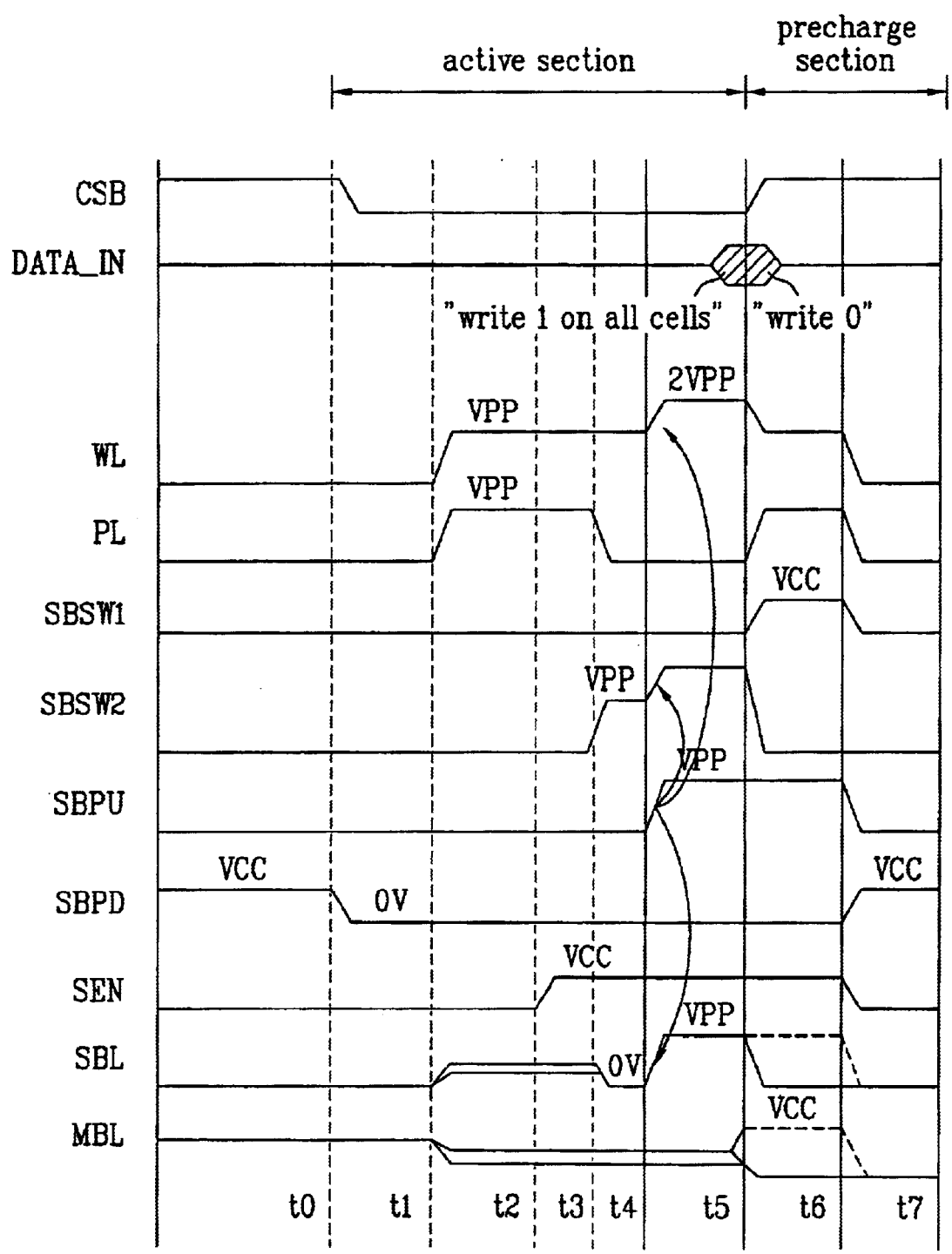
FIG. 17 illustrates an operation timing diagram of the circuits according to the first and second embodiments of the present invention in FIG. 6A and FIG. 6B.

Moreover, the present invention performing the above-explained operation can be characterized in that a first sub-bitline switch signal SBSW1, as shown in FIG. 17, is activated only for a section writing the data of logic "0".

The data of logic "0" and "1" are generally written for the precharge section. Hence, the present invention can be characterized in that one of the data of logic "0" and "1" can be written for the active section so as to reduce a precharge time.

Operation of the present invention having the above-mentioned characteristics is explained by referring to timing diagrams as follows.

In order to explain one cycle of cell operation, the cycle can be divided into active and precharge sections. A chip selection signal is at "low" level for the active section. The chip selection signal is at "high" level for the precharge section.

The entire operation timing can be divided into t0~t7 sections so as to be explained in the following.

The t0, t6, and t7 sections belong to the precharge section and the t1~t5 sections belong to the continuous active section.

The t0 section, as shown in FIG. 6 and FIG. 17, can be the precharge section prior to the active section. For the t0 section, "VCC" is applied to the sub-bitline pull-down (SBPD) applying line so as to make the sub-bitline SBL 0V.

In this case, "0V" voltage can be applied to the wordline WL, plate line PL, first & second sub-bitline switch signals SBSW1 & SBSW2, sub-bitline pull-up (SBPU) applying line, and sense amplifier enable signal (SEN) applying line.

The t1 section is a section from which the active section starts. For the t1 section, "0V" can be applied to the CSB and SBPD applying lines and the voltage of the t0 section can be maintained by the rest applying lines.

And, for the t2 section, a VPP voltage can be applied to the wordline WL and plate line PL and the voltage of the t1 section is maintained by the rest applying lines.

Hence, the sub-bitline can become "high" level to turn on the fourth switching transistor ST4, whereby the main bitline MBL drops to "low" level.

For the t3 section, the wordline and plate line WL and PL can maintain "VPP, the sense amplifier can be enabled by applying VCC to SEN, and other applying lines maintain a signal of the t2 section.

For the t4 section, the wordline WL can maintain "VPP", the plate line PL is shifted to "0V" from "VPP", the second sub-bitline switch signal (SBSW2) applying line can be shifted to "VPP", from "0V", and "0V" can be applied to the sub-bitline pull-up (SBPU) applying line so that the sub-bitline shows "low" level (0V).

In this case, the reason why the second sub-bitline switch signal SBSW2 can be previously shifted to "VPP" in the t4 section is that the data of logic "1" is written on the ferroelectric capacitor by self-boosting the wordline and SBSW2 up to 2VPP for the t5 of the active action.

For the t5 section, the data of logic "1" can be written on the entire cells. If SBPU is shifted to "VPP", when SBSW2 and SBPU are "VPP" and "0V", respectively, and SBL is floated, SBL becomes shifted to "VPP" and SBSW2 can be self-boosted to "2VPP".

Therefore, "VPP" can be transferred to the ferroelectric capacitor of the selected cell receiving the "VPP" signal of the SBL.

The t6 section can be a section from which the precharge operation starts. For the t6 section, the data of logic "0" can be written.

In this case, the WL and PL can be shifted to "VPP, the SBSW1 can be shifted to "VCC", the SBSW2 can be shifted to "0V", the SBPU can maintain "VPP" level, and the SEN can maintain "VCC" level.

In the above explanation, the SBSW1 can maintain "0V" for all sections except t6. For the t6 section, the SBSW1 can be shifted to "VCC" level so as to turn on the first switching transistor ST1.

In this case, since the cell transistor can be turned on, the "VPP" level of the plate line PL can be transferred to the gate of the fourth switching transistor ST4 through the SBL so as to turn on the fourth switching transistor ST4.

Hence, "0V" can be transferred to the main bitline MBL.

Moreover, since the first switching transistor ST1 can be turned on, "0V" of the main bitline MBL can be written on the cell through the sub-bitline SBL.

Thus, the sub-bitline can apply the voltage induced by the cell to the fourth switching transistor ST4 so as to transfer "0V" to the main bitline as well as write logic "0" on the cell through the first switching transistor ST1.

The t7 section shows the same status of the t0 section before the active operation.

In the related art, "high" data can be written on the cell using the "high" data of the bitline after the completion of the operation of the sense amplifier. In the present invention, the "high" data of the cell can be written by the SBPU signal.

Therefore, when the sense amplifier is operating independently regardless of the operation of the sense amplifier in the bitline, the "high" data can be rewritten on the cell.

Specifically, the voltage used for the cell at a low voltage operational mode can be increased by means of using the voltage boosted over VCC as the "high" voltage of the SBPU, thereby enabling to perform low voltage operation under 1.0V.

Moreover, a time required for reinforcing the "high" data continuously after the amplification of the sense amplifier is removed, enabling reduction of a cell operation time and a cycle time.

Besides, the present invention can carry out a current sensing on the main bitline MBL, thereby having an excellent sensing margin despite a large capacitance load on the main bitline or a capacitance mismatch of the main bitline itself.

Figure 18:
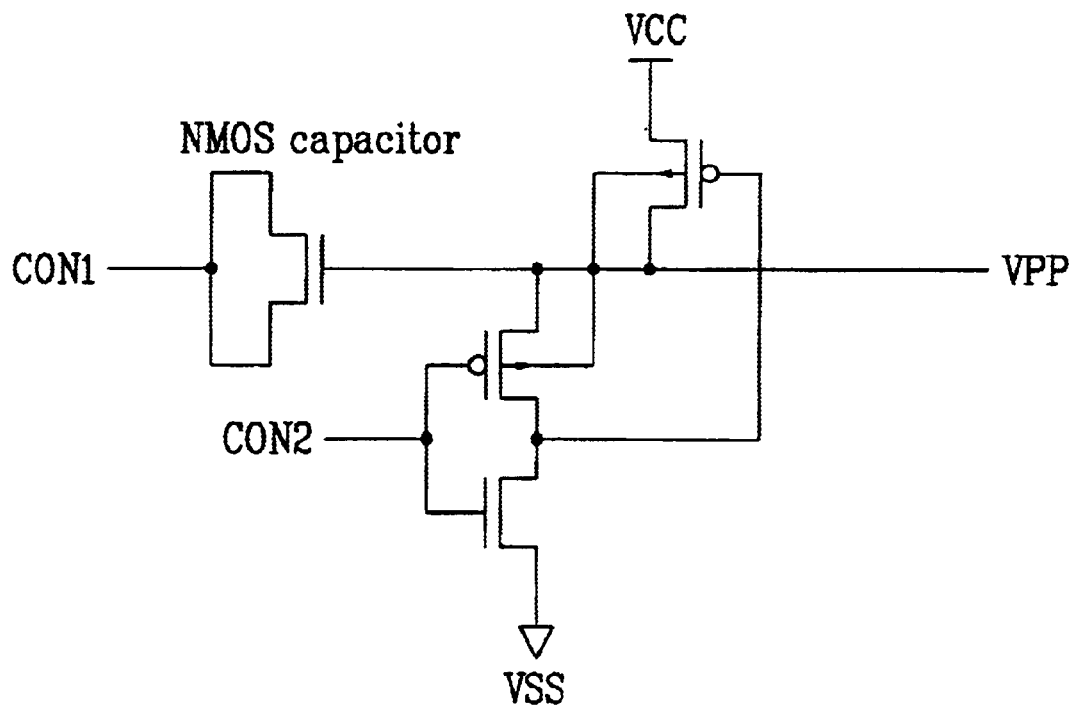
FIG. 18 illustrates a circuit and a timing diagram for explaining a VPP generation principle in a hierarchical bitline structure.
Figure 18:
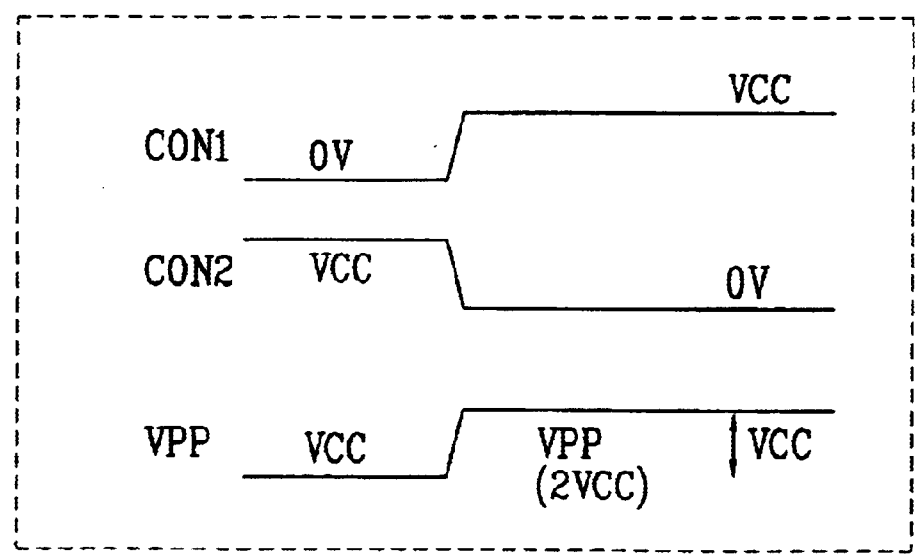
Figure 19:
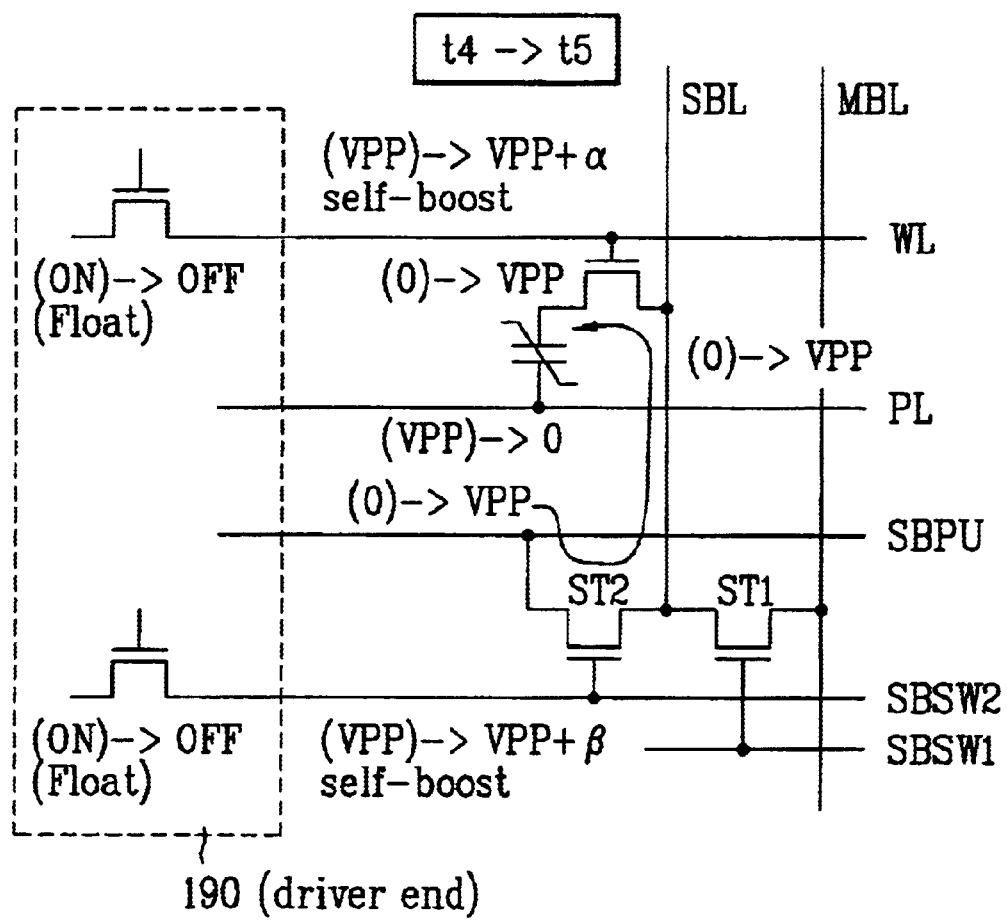
FIG. 19 illustrates a circuit for explaining a self-boost operation in a hierarchical bitline structure.

Self-boosting operation carried out for transferring VPP to the ferroelectric capacitor of the cell in the above-explained cell operation is shown in the circuits in FIG. 18 and FIG. 19.

FIG. 18 illustrates a circuit and a timing diagram for explaining a VPP generation principle in a hierarchical bitline structure, in which circuit and operation of generating VPP in accordance with first and second control signals CON1 and CON2 are explained.

Referring to FIG. 18, the circuit of generating VPP in accordance with first and second control signals CON1 and CON2 can include an NMOS capacitor having one end receiving a CON1 signal, a CMOS transistor connected between the other end (gate input end) of the NMOS capacitor and a ground voltage terminal VSS so as to be driven by receiving a CON2 signal, and a PMOS transistor connected between a power supply voltage terminal VCC so as to determine an output signal by receiving a signal of an output terminal of the CMOS transistor.

Operation in FIG. 18 is explained as follows. When 0V and VCC are applied to the CON1 and CON2, respectively, VCC is outputted to the output terminal VCC. When VCC and 0V are applied to the CON1 and CON2, respectively, VPP is outputted to the output terminal VPP.

In this case, VCC is twice greater than VCC so as to be equal to 2VCC.

Application of such a principle to the operation of storing VPP in the ferroelectric capacitor of the cell is explained as follows.

Referring to FIG. 19, when the SBPU applying line and SBL show 0V respectively and the SBSW2 applying line indicates VPP, if VPP is applied to the SBPU, the SBSW2 is self-boosted so as to show 2VPP.

Thus, if the SBSW2 is self-boosted to 2VPP, VPP is transferred to the SBL through the second switch transistor ST2.

When the plate line PL, sub-bitline SBL, and wordline WL show VPP, 0V, and VPP, respectively, if the plate line and SBL are shifted to 0V and VPP, respectively, the wordline is self-boosted so as to become 2VPP(VPP+α).

In this case, first and second switch devices of NMOS transistors can be formed at a driver end 190 so as to control the signals transferred to the SBSW2 applying line and wordline WL. The first and second switch devices can be turned on before the self-boosting operation starts. The first and second switch devices can be turned off at a time point that the self-boosting operation starts.

Thus, VPP can be stored in the ferroelectric capacitor by the self-boosting operation through the cell transistor.

A read operation is explained by referring to FIG. 20A and FIG. 20B as follows, in which the cell data of the present invention include "1" and "0".

Figure 20A:
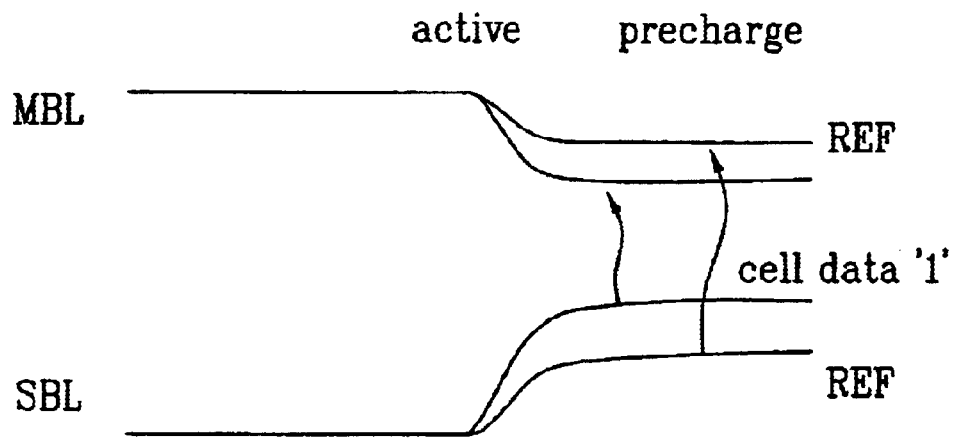
FIG. 20A and FIG. 20B illustrate operation timing diagrams for explaining a read operation in a hierarchical bitline structure.
Figure 20B:
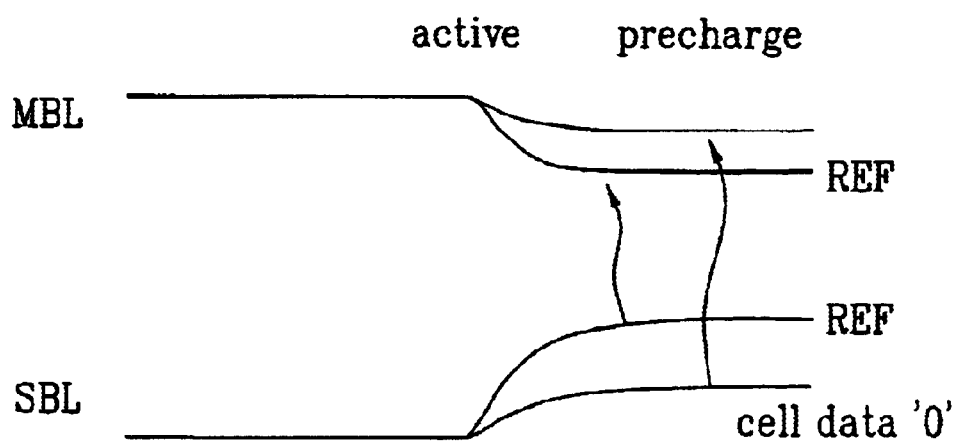

FIG. 20A and FIG. 20B illustrate operation timing diagrams for explaining a read operation in a hierarchical bitline structure.

Referring to FIG. 20A, when a data of logic "1" is stored in a unit cell, a voltage of the sub-bitline SBL on read can become "high" level so as to increase a current flow of the fourth switching transistor. Thus, a voltage of ground level can be transferred to the main bitline MBL, whereby a level of the main bitline becomes lower than a reference level.

On the contrary, when a data of logic "0" can be stored in the unit cell, as shown in FIG. 20B, the voltage of the sub-bitline SBL on read becomes "low" level so as to decrease the current flow of the fourth switching transistor. Hence, the voltage of the main bitline becomes higher than the reference level.

Next, nonvolatile ferroelectric memory devices and operations thereof according to third and fourth embodiments of the present invention are explained as follows.

Figure 7A:
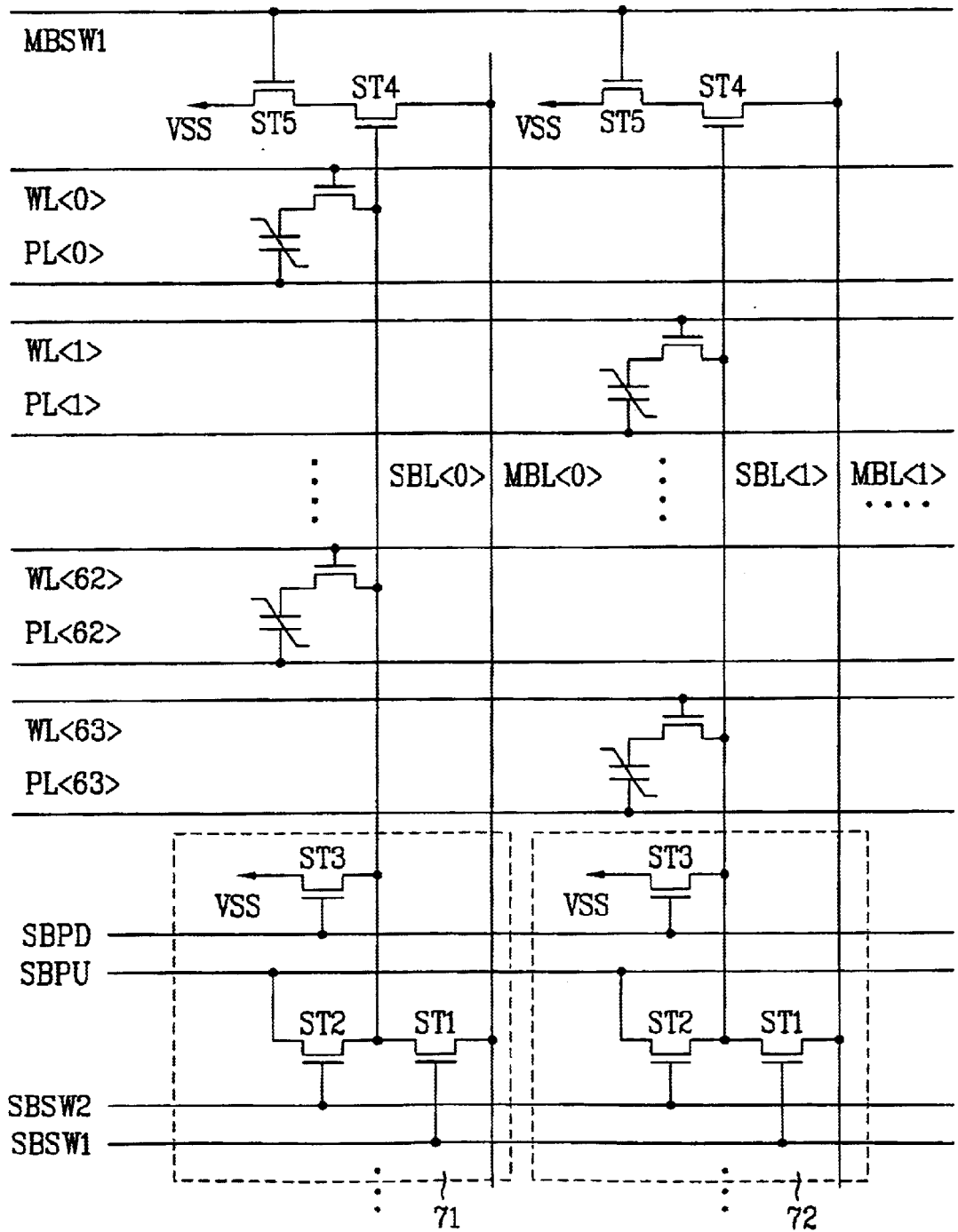
FIG. 7A and FIG. 7B illustrate detailed circuits of sub-cell array blocks according to third and fourth embodiments of the present invention, respectively.
Figure 7B:
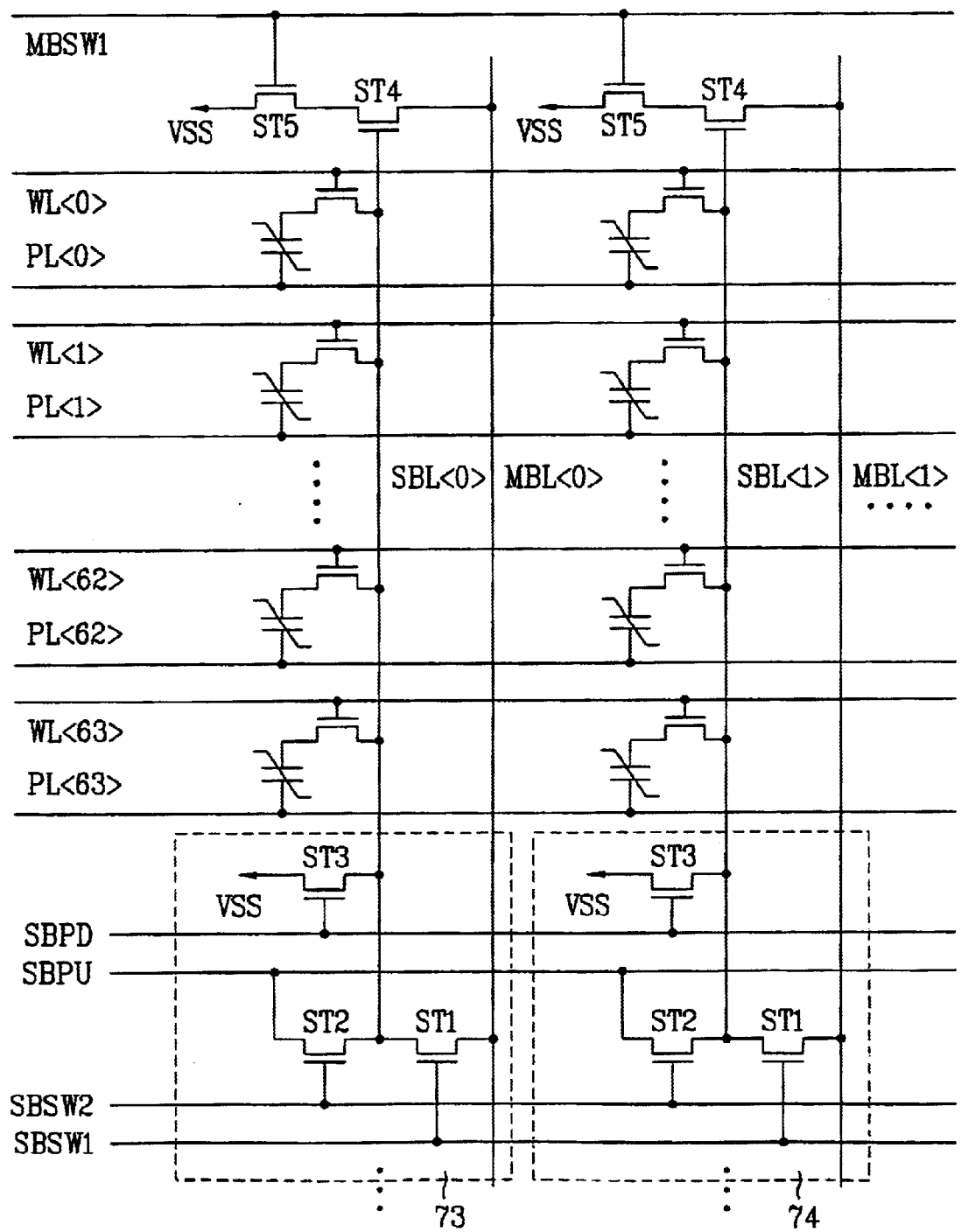

The nonvolatile ferroelectric memory devices according to the third and fourth embodiments of the present invention, as shown in FIG. 7A and FIG. 7B, further include fifth switching transistors ST5 in addition to the circuit constitutions of the first and second embodiments of the present invention, respectively. Each of the fifth switching transistors ST5 can be constituted with an NMOS transistor enabling to prevent current leakage on writing a data.

In this case, the fifth switching transistors ST5 can be formed plurally so as to correspond to the fourth switching transistors controlled by the sub-bitlines, respectively. In the fifth switching transistor ST5, a gate end can be connected to the main bitline switching signal MBSW1, a drain end can be connected to the source end of the fourth switching transistor ST4, and a source end can be connected to the ground voltage terminal.

The third embodiment according to the present invention has the folded bitline (B/L) structure, and the fourth embodiment according to the present invention has the open bitline (B/L) structure.

Methods of driving the nonvolatile ferroelectric memory devices having the fifth switching transistors included therein according to the third and fourth embodiments of the present invention are explained as follows.

Figure 21:
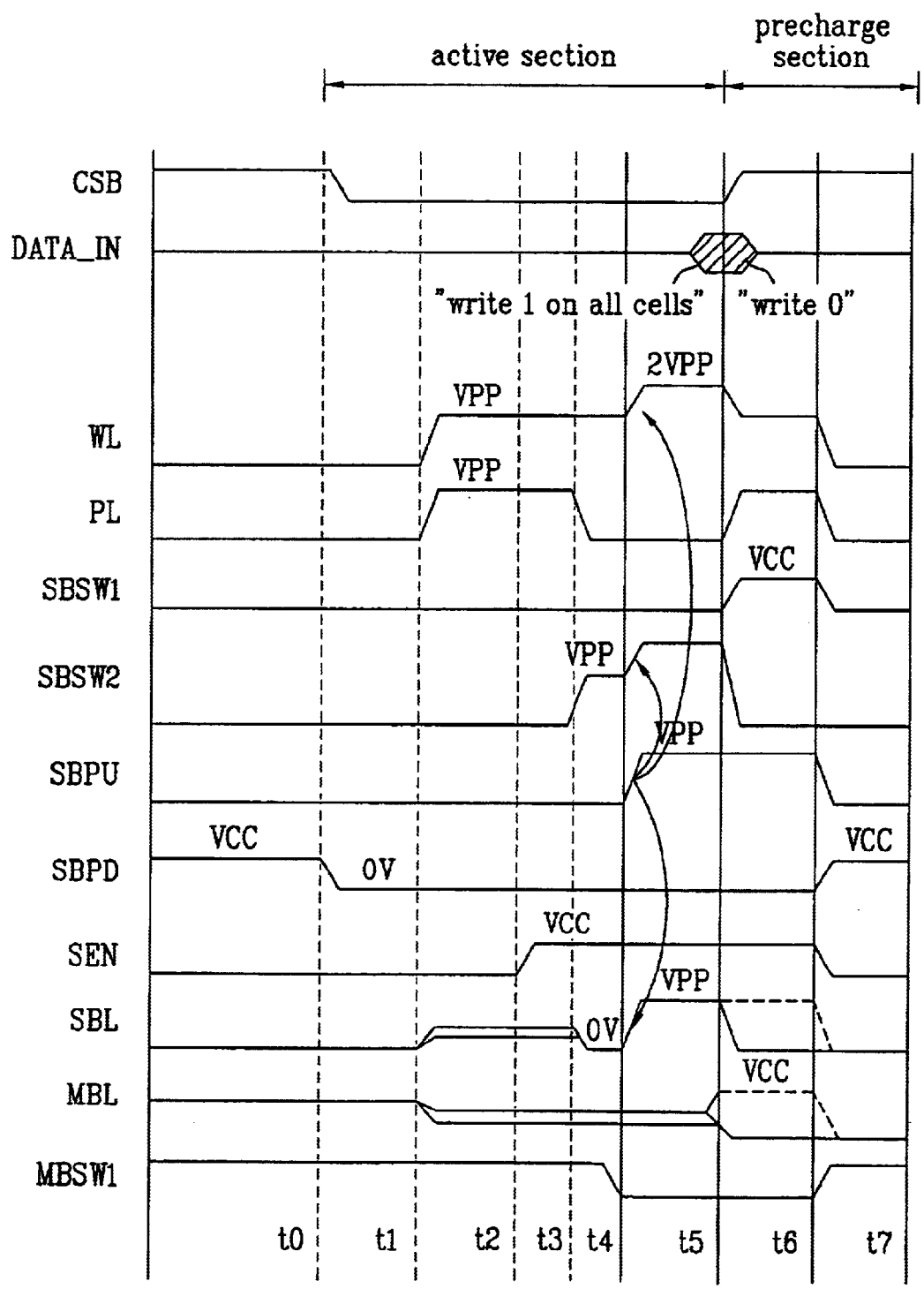
FIG. 21 illustrates an operation timing diagram of the circuits according to the third and fourth embodiments of the present invention in FIG. 7A and FIG. 7B.

The methods of driving the nonvolatile ferroelectric memory devices according to the third and fourth embodiments of the present invention, as shown in FIG. 21, can be constituted in a manner that a timing of the MBSW1 is added to each of the driving methods according to the first and second embodiments of the present invention.

Namely, the MBSW1 shows the "low" level only when the data of logic "1" and "0" are written so as to turn off the fifth switching transistor ST5. In this case, the data of logic "1" is written on the entire cells.

Next, nonvolatile ferroelectric memory devices according to fifth and sixth embodiments of the present invention are explained as follows.

Figure 7C:
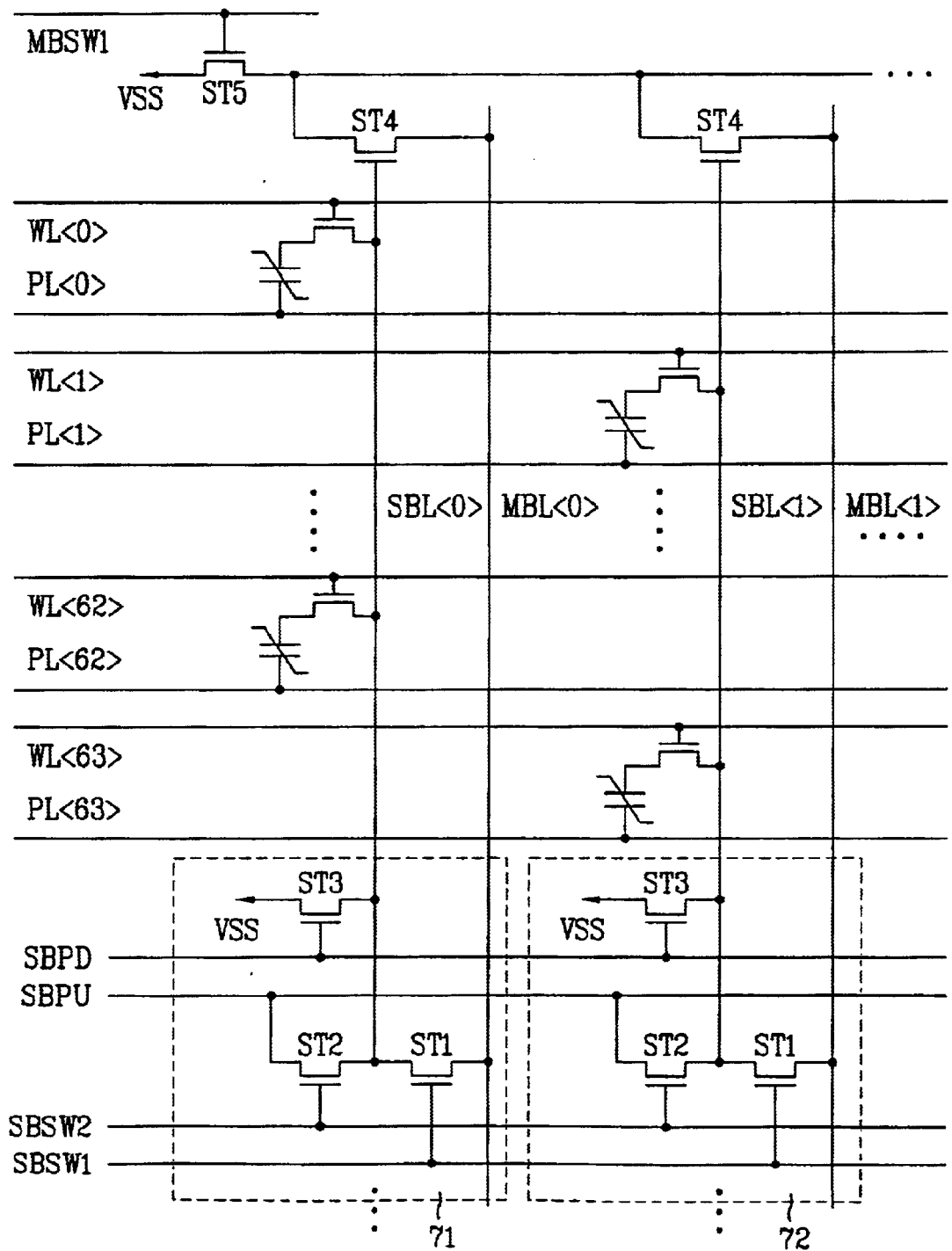
FIG. 7C and FIG. 7D illustrate detailed circuits of sub-cell array blocks according to fifth and sixth embodiments of the present invention, respectively.
Figure 7D:
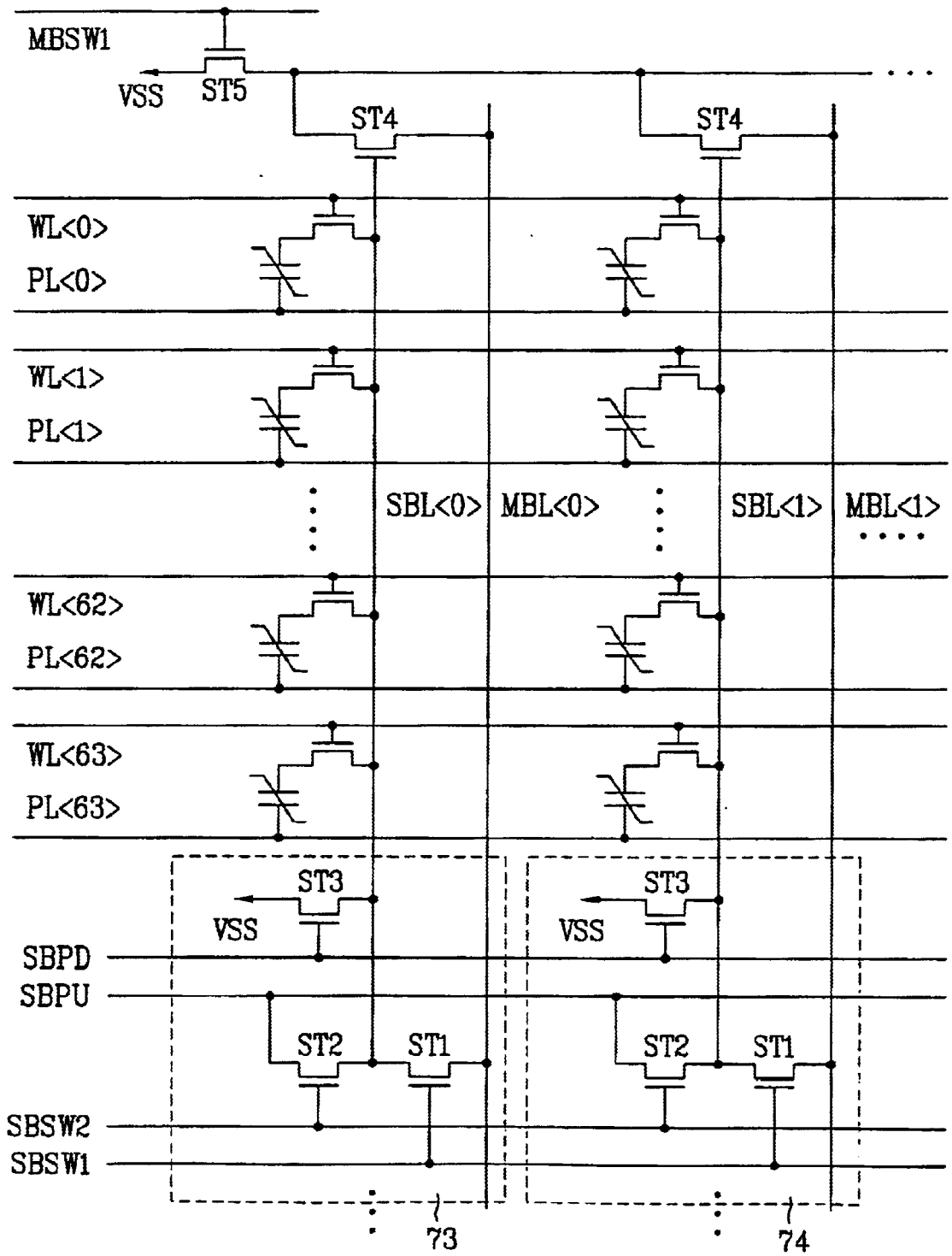

The nonvolatile ferroelectric memory devices according to the fifth and sixth embodiments of the present invention, as shown in FIG. 7C and FIG. 7D, can further include fifth switching transistors ST5 in addition to the circuit constitutions of the first and second embodiments of the present invention, respectively. And, each of the fifth switching transistors ST5 is constituted with an NMOS transistor enabling to prevent current leakage on writing a data.

In the fifth switching transistor ST5, a gate end can be connected to the main bitline switching signal MBSW1, a drain end can be connected in common to the source ends of the fourth switching transistors ST4, and a source end can be connected to the ground voltage terminal VSS. Each sub-cell array block can have one fifth transistor ST5 only.

The fifth embodiment according to the present invention has the folded bitline (B/L) structure, and the sixth embodiment according to the present invention has the open bitline (B/L) structure.

Accordingly, the above-described nonvolatile ferroelectric memory device and driving method thereof according to the present invention have the following advantages or effects.

First of all, a plurality of the cell arrays can share commonly a single sensing amplifier unit constituted with a plurality of the sensing amplifiers, thereby enabling to increase a layout efficiency of the device.

Secondly, the present invention enables to sense the data of the unit cell by comparing/sensing the voltage of the main bitline MBL using the current value of the fourth transistor which varies in accordance with the cell data value, thereby having an excellent sensing margin despite a large capacitance load on the main bitline or a capacitance mismatch of the main bitline itself.

Thirdly, the present invention can include the fifth switching transistors, thereby preventing a sensing error caused by current leakage on writing data.

Finally, the present invention can have each sub-cell array block include a single fifth switching transistor, thereby preventing the problem of current leakage as well as being effective in increasing a layout efficiency.

It will be apparent to those skilled in the art that various modifications and variations can be made in the nonvolatile ferroelectric memory device and driving method of the present invention. Thus, it is intended that the present invention covers the modifications and variations of this invention provided they come within the scope of the appended claims and their equivalents.

What is claimed is:

1. A nonvolatile ferroelectric memory device comprising:
    a plurality of cell array blocks, each of the cell array blocks including a plurality of sub-cell array blocks, each of the sub-cell array blocks including a plurality of unit cells;
    a plurality of main bitlines formed in the sub-cell array blocks in one direction so as to correspond to each other by column unit;
    a plurality of sub-bitlines aligned in the sub-cell array blocks in a same direction of the main bitlines so as to be connected to terminals of the unit cells to induce voltages on the unit cells, respectively;
    a sense amplifier block having a plurality of sense amplifiers shared in common by a plurality of the cell array blocks so as to amplify a signal of each of the main bitlines; and
    at least one switching transistor formed in at least one of the cell array blocks, the switching transistor having a gate controlled by a corresponding one of the sub-bitlines which receives a voltage value induced from the unit cell, a drain connected to a corresponding one of the main bitlines, and a source connected to a ground voltage terminal, the switching transistor capable of current-sensing a data value of the unit cell by varying a voltage transferred to the corresponding main bitline as a current amount varies in accordance with the voltage induced on the corresponding one of the sub-bitlines.

2. The nonvolatile ferroelectric memory device of claim 1, wherein the at least one switching transistor is formed at each of the cell array blocks.

3. A nonvolatile ferroelectric memory device comprising:
    a plurality of cell array blocks, each of the cell array blocks including a plurality of sub-cell array blocks, each of the sub-cell array blocks including a plurality of unit cells;
    a plurality of main bitlines formed in the sub-cell array blocks in one direction so as to correspond to each other by column unit;
    a plurality of sub-bitlines aligned in the sub-cell array blocks in a same direction of the main bitlines so as to be connected to terminals of the unit cells to induce voltages on the unit cells, respectively;
    a sense amplifier block having a plurality of sense amplifiers shared in common by a plurality of the cell array blocks so as to amplify a signal of each of the main bitlines;
    a switching control block formed in at least one of the sub-cell array blocks so as to control whether one of the sub-bitlines and one of the main bitlines are connected to each other or not, the switching control block having first to third switching transistors for controlling pull-up and pull-down of the sub-bitlines;
    at least one fourth switching transistor formed in at least one of the sub-cell array blocks so as to be controlled by one of the sub-bitlines which receives a voltage value induced from the unit cell, the fourth switching transistor capable of sensing a voltage of a corresponding one of the main bitlines as a current value varies in accordance with a data value of one of the unit cells;

a plurality of column selector blocks, each having a plurality of column selectors so as to correspond to the cell array blocks;

a reference generation block corresponding to the sense amplifier block, the reference generation block including a plurality of reference generation units; and a plurality of main bitline pull-up blocks capable of pulling up the main bitlines.

4. The nonvolatile ferroelectric memory device of claim 3, further comprising:

a plurality of fifth switching transistors between the fourth switching transistors and a ground voltage terminal, respectively so as to prevent current leakage on writing data; and a main bitline switching signal applying line in at least one of the sub-cell array blocks.

5. The nonvolatile ferroelectric memory device of claim 4, wherein the fifth switching transistor has a gate end connected to the main bitline switching signal applying line, a drain end connected to a source of the fourth transistor, and a source end connected to the ground voltage terminal.

6. The nonvolatile ferroelectric memory device of claim 3, wherein the sense amplifier block includes:

a plurality of sense amplifiers corresponding to signal buses one by one;

a write control unit driven by receiving a data transferred through one of the signal buses;

a sixth switching transistor formed between one of the signal buses and a power supply voltage terminal;

a seventh switching transistor formed between a reference bus and a ground voltage terminal; and an eighth switching transistor formed between the reference bus and power supply voltage terminal.

7. The nonvolatile ferroelectric memory device of claim 6, wherein each of the sense amplifiers includes:

a current type first sense amplifier unit driven by receiving a first sensing signal through the signal and reference buses;

a sense amplifier control unit controlling an output signal of the first sense amplifier unit; and a latch type second sense amplifier unit driven by a control of the sense amplifier control unit.

8. The nonvolatile ferroelectric memory device of claim 3, wherein the reference generation block includes:

a plurality of reference capacitors connected in parallel with each other, each having first and second electrodes connected to a reference plate line and a reference line as a storage node, respectively; and a level initialization unit having a gate to which a reference cell equalizer control signal is applied, one electrode connected to a ground terminal, and another electrode connected to the reference line as the storage node.

9. The nonvolatile ferroelectric memory device of claim 3, wherein when one of the sub-cell array blocks has a hierarchical folded bitline structure, the sub-cell array block has an arrangement in a manner that the unit cells fail to be overlapped with each other if the sub-cell array is folded centering around one of the main bitlines.

10. The nonvolatile ferroelectric memory device of claim 3, wherein when one of the sub-cell array blocks has a hierarchical open bitline structure, the sub-cell array block has an arrangement in a manner that the unit cells are overlapped with each other if the sub-cell array is folded centering around one of the main bitlines.

11. The nonvolatile ferroelectric memory device of claim 3, wherein the cell array blocks, column selector blocks, and main bitline pull-up blocks are arranged symmetrically upward and downward centering around the sense amplifier block.

12. The nonvolatile ferroelectric memory device of claim 3, wherein the fourth switching transistor has a source connected to a ground voltage terminal, a drain connected to corresponding one of the main bitlines, and a gate connected to a corresponding one of the sub-bitlines.

13. The nonvolatile ferroelectric memory device of claim 3, wherein the switching control block is formed in each of the sub-cell array blocks and the at least one fourth switching transistor is formed in each of the sub-cell array blocks.

14. A nonvolatile ferroelectric memory device comprising:

a plurality of cell array blocks, each of the cell array blocks including a plurality of sub-cell array blocks, each of the sub-cell array blocks including a plurality of unit cells;

a plurality of main bitlines formed in the sub-cell array blocks in one direction so as to correspond to each other by column unit;

a plurality of sub-bitlines aligned in the sub-cell array blocks in a same direction of the main bitlines so as to be connected to a terminal of the unit cells to induce voltages on the unit cells, respectively;

a sense amplifier block having a plurality of sense amplifiers shared in common by a plurality of the cell array blocks so as to amplify a signal of each of the main bitlines;

a switching control block formed in at least one of the sub-cell array blocks so as to control whether the sub-bitline and main bitline are connected to each other or not, the switching control block having first to third switching transistors for controlling pull-up and pull-down of the sub-bitlines;

a plurality of fourth switching transistors formed in the sub-cell array blocks so as to be controlled by the sub-bitlines receiving voltage values induced from the unit cells, respectively, the fourth switching transistors sensing a voltage of a corresponding main bitline as a current value varies in accordance with a data value of the corresponding unit cell;

a fifth switching transistor formed in the sub-cell array blocks, the fifth switching transistor having a gate end connected to a main bitline switching signal, a drain end connected to a source end of the fourth switching transistors in common, and a source end connected to a ground voltage terminal;

a plurality of column selector blocks, each having a plurality of column selectors so as to correspond to the cell array block;

a reference generation block corresponding to the sense amplifier block, the reference generation block comprising a plurality of reference generation units; and a plurality of main bitline pull-up blocks pulling up the main bitlines.

15. The nonvolatile ferroelectric memory device of claim 14, wherein a switching control block is formed in each of the sub-cell array blocks and each of the sub-cell array blocks includes a fifth switching transistor.

16. A method of driving a nonvolatile ferroelectric memory device, comprising the steps of:

preparing the nonvolatile ferroelectric memory device including a plurality of cell array blocks sharing use of a sense amplifier block in common and controlled by a sub-bitline receiving a voltage value induced from a unit cell so as to sense a data value stored in the unit cell by sensing a voltage of a main bitline connected to a drain terminal of a first switching transistor of which current value is varied in accordance with the data value of the unit cell;

inducing the data value stored in the unit cell to the sub-bitline by applying a voltage of high level to a wordline and a plate line;

sensing the data value stored in the unit cell by comparing a voltage value of the main bitline connected to the drain terminal of the first switching transistor to a reference value wherein the current value flowing through the first switching transistor varies in accordance with a value induced to the sub-bitline; and writing a logic "1" data on the unit cell for an active section by a self-boosting operation and a logic "0" data on the unit cell for a precharge section following the active section.

17. The method of claim 16, wherein if the logic "1" data is stored in the unit cell, further comprising the steps of:

transferring the voltage of high level to the sub-bitline and a voltage of ground level to the main bitline wherein the current value flowing through the first switching transistor is sufficient; and comparing the voltage value transferred to the main bitline to the reference value so as to sense that the logic "1" data is stored in the unit cell.

18. The method of claim 16, wherein a second switching transistor is further formed between a ground voltage terminal and a source end of the first switching transistor so as to output a "low" level only when the logic "1" and "0" data are written on the unit cell.

19. The method of claim 16, wherein the step of writing the logic "1" and "0" data on the unit cell, if the active section is divided into continuous t1 to t5 sections, and the precharge section includes t0 and t6 sections, comprises the steps of:

pulling down the sub-bitline to "low" level by applying a voltage of a first high level (VCC) to a sub-bitline pull-down (SBPD) signal applying line for the t0 section;

shifting a chip selection signal and the SBPD to "low" level for the t1 section;

applying a voltage of a second high level (VPP) greater than that of the first high level (VCC) to both of the wordline for t2 to t4 sections and the plate line for t2 and t3 sections so as to transfer the data of the unit cell to the sub-bitline and shifting the main bitline to a reduced predetermined level through the first switching transistor;

writing the logic "1" data on a ferroelectric capacitor by applying the voltage of the second high level (VPP) to an SBSW2 applying line for the t4 section so as to shift the plate line to low level and applying the voltage of the second high level to the SBPU applying line for the t5 section so as to self-boost the wordline and SBSW2 to a voltage of a third high level greater than the second high level (VPP); and writing the logic "0" data on the ferroelectric capacitor by shifting the wordline and plate line to the second high level for the t6 section and applying the voltage of the first high level to the SBSW1 applying line for the t6 section only.

20. The method of claim 19, wherein the voltage of the second high level is twice greater than that of the first high level.

21. The method of claim 19, wherein the self-boosted voltage of the third high level is twice greater than the voltage of the second high level.

* * * * *